(12) United States Patent　　(10) Patent No.: US 12,382,601 B2
Hashimoto et al.　　(45) Date of Patent: Aug. 5, 2025

(54) SAMPLE HOLDER AND SUPERCONDUCTING QUANTUM COMPUTER

(71) Applicant: NEC Corporation, Tokyo (JP)

(72) Inventors: Yoshihito Hashimoto, Tokyo (JP); Tsuyoshi Yamamoto, Tokyo (JP)

(73) Assignee: NEC CORPORATION, Tokyo (JP)

( * ) Notice: Subject to any disclaimer, the term of this patent is extended or adjusted under 35 U.S.C. 154(b) by 341 days.

(21) Appl. No.: 17/994,728

(22) Filed: Nov. 28, 2022

(65) Prior Publication Data

US 2023/0171908 A1　Jun. 1, 2023

(30) Foreign Application Priority Data

Nov. 29, 2021　(JP) .............................. JP2021-193426

(51) Int. Cl.
*H05K 7/02*　(2006.01)
*H05K 1/18*　(2006.01)

(52) U.S. Cl.
CPC ............... *H05K 7/02* (2013.01); *H05K 1/181* (2013.01)

(58) Field of Classification Search
CPC ....................................................... H05K 7/02
USPC ........................................................ 361/761
See application file for complete search history.

(56) References Cited

U.S. PATENT DOCUMENTS

| 3,641,398 A * | 2/1972 | Fitzgerald, Jr. ......... H01L 24/49 257/E23.101 |
| 5,652,696 A * | 7/1997 | Traylor .................... H01L 24/48 361/764 |
| 2015/0228592 A1* | 8/2015 | Takagi .................. H01L 23/481 257/664 |
| 2020/0176671 A1* | 6/2020 | Cok ...................... H03H 9/1092 |

FOREIGN PATENT DOCUMENTS

| JP | 2002-057513 A | 2/2002 |
| JP | 2002-299503 A | 10/2002 |
| JP | 2003-297972 A | 10/2003 |
| JP | 2005-294693 A | 10/2005 |
| JP | 2010-056509 A | 3/2010 |
| JP | 2015-149420 A | 8/2015 |

OTHER PUBLICATIONS

B. Lienhard, et al., "Microwave Packaging for Superconducting Qubits", arXiv: 1906.05425v1 [quant-ph], Jun. 12, 2019.

* cited by examiner

*Primary Examiner* — Stanley Tso
(74) *Attorney, Agent, or Firm* — Sughrue Mion, PLLC

(57) ABSTRACT

A sample holder includes: a pedestal made of metal; and a PCB (Printed Circuit Board) placed on the pedestal. The PCB includes a through opening that penetrates from a front surface to a rear surface of the PCB. The pedestal includes a cavity bottomed and with a top of the pedestal opened, the cavity formed at a portion corresponding to directly under the through opening on a side of the pedestal on which the PCB is placed. As a configuration on the side on which the PCB is placed, viewed from above, a part of the cavity is protruded outward from the through opening.

17 Claims, 45 Drawing Sheets

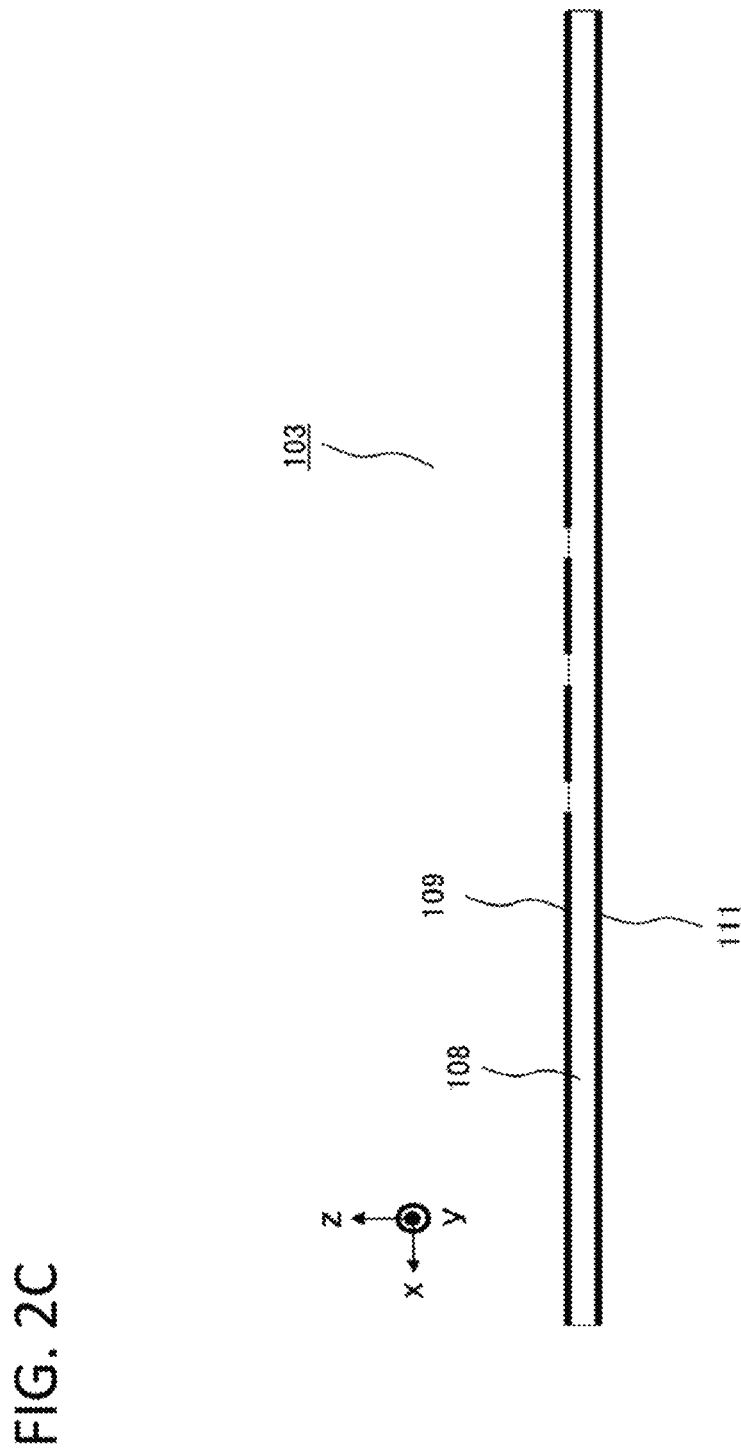

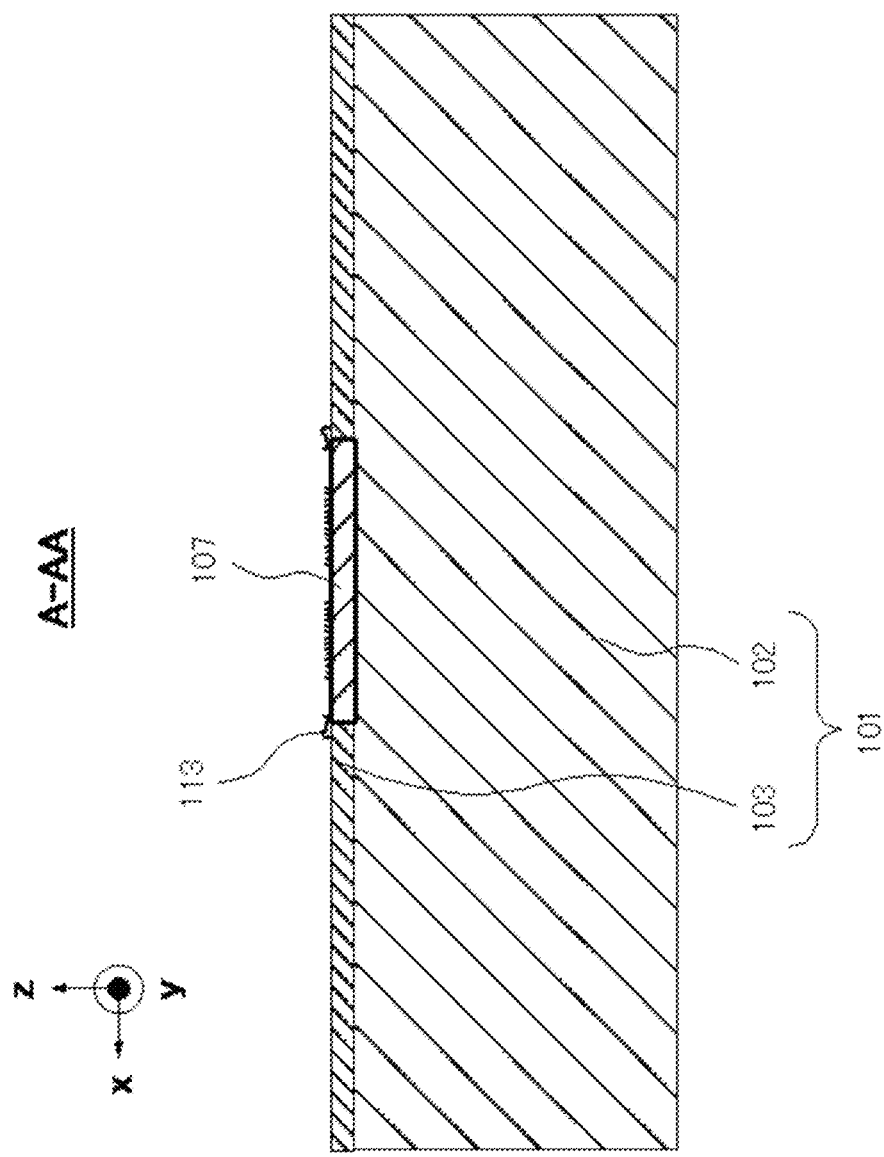

SAMPLE HOLDER AND SUPERCONDUCTING QUANTUM COMPUTER

FIELD

Cross Reference to Related Applications

This application is based upon and claims the benefit of the priority of Japanese patent application No. 2021-193426, filed on Nov. 29, 2021, the disclosure of which is incorporated herein in its entirety by reference thereto.

The present invention relates to a sample holder.

BACKGROUND

A superconducting quantum circuit is formed using a wiring layer of a superconducting material such as niobium (Nb) or aluminum (Al) which is fabricated on a surface of a substrate such as a silicon substrate. Those that have a superconducting quantum circuit formed on a substrate are called "chips". A superconducting quantum circuit is operated with a chip mounted on a sample holder. Various structures are known for the sample holder. Non-Patent Literature (NPL) 1 discloses a method of mounting a chip on a sample holder, wherein the chip with a circuit surface thereof not flipped is mounted on a printed circuit board (a surface on which a superconducting quantum circuit is formed, is abbreviated as a "circuit surface"). Patent Literature (PTL) 1 discloses a method of mounting, on a printed circuit board, a chip with a circuit surface of the chip flipped (flip-chip mounting). The following describes the former mounting method.

There is known a configuration in which a Printed Circuit Board (hereinafter also abbreviated as "PCB") is placed on (a placement surface of) a pedestal made of a metal constituting a sample holder. More specifically, a through opening is provided near a center of the PCB. A chip is placed in the through opening. Electrical connection between pads on a circuit surface of the chip placed in the through opening and pads on the PCB, and electrical connection between a ground of the circuit surface of the chip and a ground of the PCB, are performed by bonding wires such as Al, respectively. In this case, an opposite side face (rear surface) of the chip opposite to the circuit surface is in contact with (or abutting to) the metal pedestal.

In the case where the chip is mounted on the sample holder as described above, resonance occurs when a signal of a specific frequency is supplied to a superconducting quantum circuit of the chip. This resonance is referred to as "chip-mode resonance".

The chip-mode resonance, when coupled with the superconducting quantum circuit mounted on the chip, induces decoherence in the superconducting quantum circuit. One known measure to reduce an influence of this decoherence is to raise a resonance frequency of the chip-mode as high as possible. For example, in PTL 1 discloses a technique to suppress an influence of the chip-mode, in a structure as described above (the chip is placed in the through opening of the PCB mounted on the pedestal and the rear surface of the chip is in surface contact with the pedestal), by hollowing out a part of the placement surface of the metal pedestal directly under the chip to form a cavity directly under the chip.

[PTL 1] Japanese Patent Kokai Publication No. 2002-299503 A

[NPL 1] B. Lienhard, et al., "Microwave Packaging for Superconducting Qubits," arXiv: 1906.05425v1 [quant-ph] 12 Jun. 2019.

SUMMARY

When a chip is mounted in a sample holder, it is required to raise a resonance frequency of a resonance that occurs responsive to a signal of a specific frequency supplied to the chip, to a value higher than the technique described in NPL 1. It is an object of the present disclosure to solve the above problem and to provide a sample holder capable of raising a resonance frequency of a chip-mode in a superconducting quantum circuit.

According to one aspect of the present disclosure, there is provided a sample holder that includes a pedestal made of metal and a Printed Circuit Board (PCB) placed on the pedestal. The PCB includes a through opening that penetrates from a front surface to a rear surface of the PCB. The pedestal includes a cavity bottomed and with a top of the pedestal opened, the cavity formed at a portion corresponding to directly under the through opening on a side of the pedestal on which the PCB is placed. As a configuration on the side on which the PCB is placed, viewed from above, a part of the cavity is protruded outward from the through opening.

According to the present disclosure, in case where a chip is mounted in a sample holder, it is possible to raise a resonance frequency of a resonance that occurs when a signal of a specific frequency is supplied to the chip higher.

BRIEF DESCRIPTION OF THE DRAWINGS

FIG. 2C is a diagram illustrating a side view of the PCB.

FIG. 3B is a diagram illustrating an end view of the configuration when a chip with a superconducting quantum circuit is mounted on the sample holder illustrated in FIG. 1A and FIG. 1B, cutting along a plane parallel to a x-z plane including a cutting line A-AA illustrated in FIG. 3A.

FIG. 4B is mounted on the sample holder illustrated in FIG. 7A, FIG. 7B and FIG. 7C.

EXAMPLE EMBODIMENTS

Example embodiments of a sample holder and a superconducting quantum computer according to the present disclosure will be described with reference to the drawings. Note that the drawings schematically illustrate configurations according to the example embodiment of the present disclosure. The example embodiment of the present disclosure described below are examples and can be modified to an extent that the gist thereof is the same. Identical or similar numeral (or symbols) are assigned to identical or similar parts throughout the drawings. In the following drawings, elements and the like not used in the description are omitted from the illustrations as appropriate. In the following descriptions, ground may be denoted as "GND". For example, a front surface ground is denoted as "front surface GND" and a rear surface ground is denoted as "rear surface GND".

In order to further clarify an effect of a sample holder according to each example embodiment, a result of a simulation using a model that models a sample holder similar to the sample holder described in NPL 1 is compared with a result of a simulation using a model that models a sample holder according to each example embodiment. Before describing each example embodiment in detail, some issues regarding a chip-mode in a superconducting quantum circuit will be described in more detail. Then, a result of the simulation using the model that models the sample holder similar to the sample holder described in NPL 1 will be described.

The sample holder similar to the sample holder described in NPL 1 has a configuration in which a PCB is placed on a metal pedestal. The sample holder includes a through opening opened close to a center of the PCB. The sample holder includes a cavity directly under a chip formed by hollowing out a part of the metal pedestal directly under the chip.

In the description of each drawing, x-axis, y-axis, and z-axis of three-dimensional coordinate system will be used as needed to clarify each orientation.

Figure 1A:
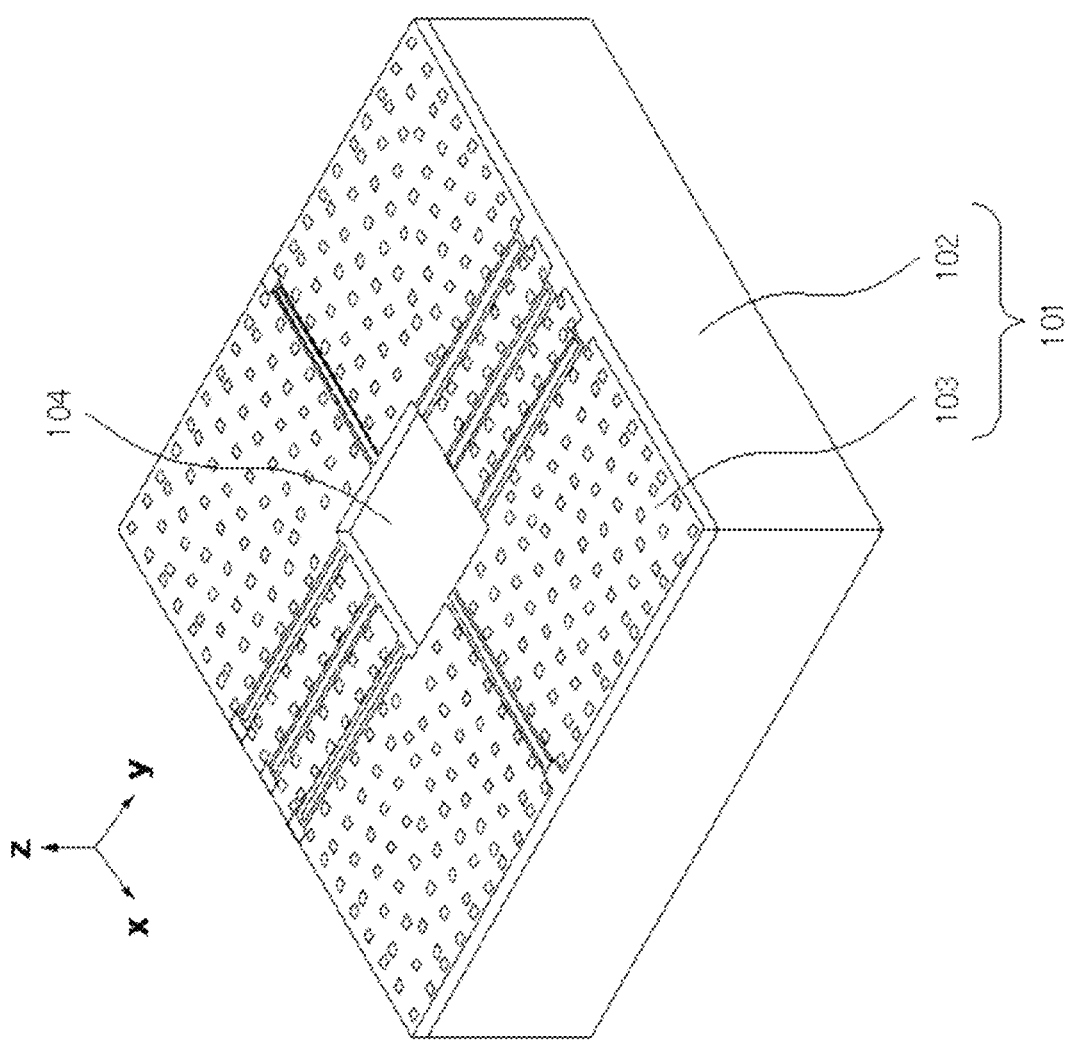
FIG. 1A is a diagram illustrating an example of a sample holder in which a chip that a superconducting quantum circuit is formed thereon is accommodated.
Figure 1B:
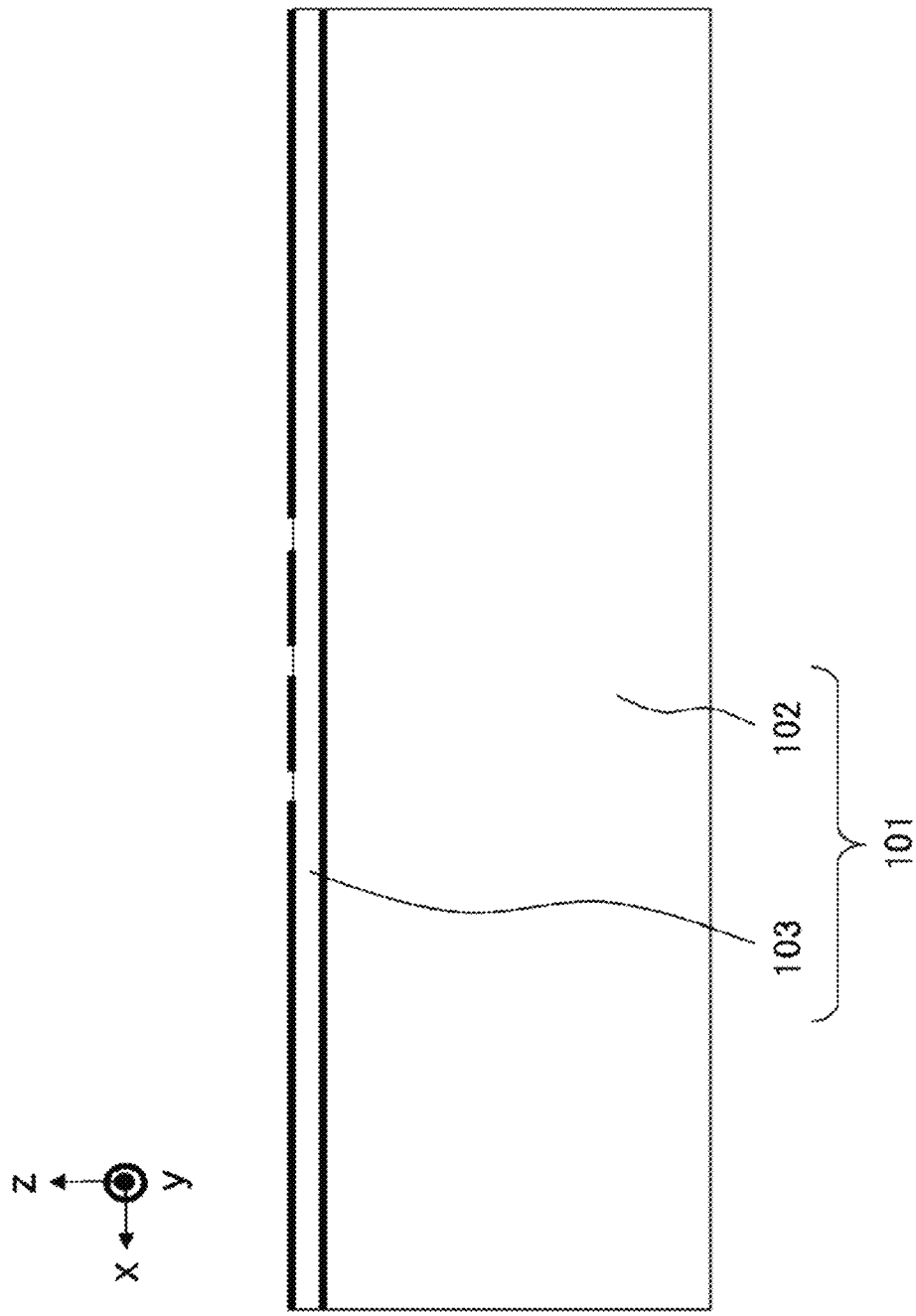
FIG. 1B is a diagram illustrating a side view of the sample holder illustrated in FIG. 1A.

FIG. 1A is a diagram illustrating an example of a sample holder in which a chip that a superconducting quantum circuit is formed thereon is accommodated. FIG. 1B is a side view of the sample holder 101 viewed from a direction of y-axis, in FIG. 1A. As illustrated in FIG. 1A. the sample holder 101 has a configuration in which a PCB 103 is placed on a pedestal 102 made of metal (a metal pedestal 102). In FIG. 1A, a three-dimensional shape of the pedestal 102 is a rectangular prism (cuboid) or a cube. AT a center of the surface of the PCB 103, there is provided with a through opening 104 penetrating through the PCB 103 from a front surface to a rear surface.

Figure 2A:
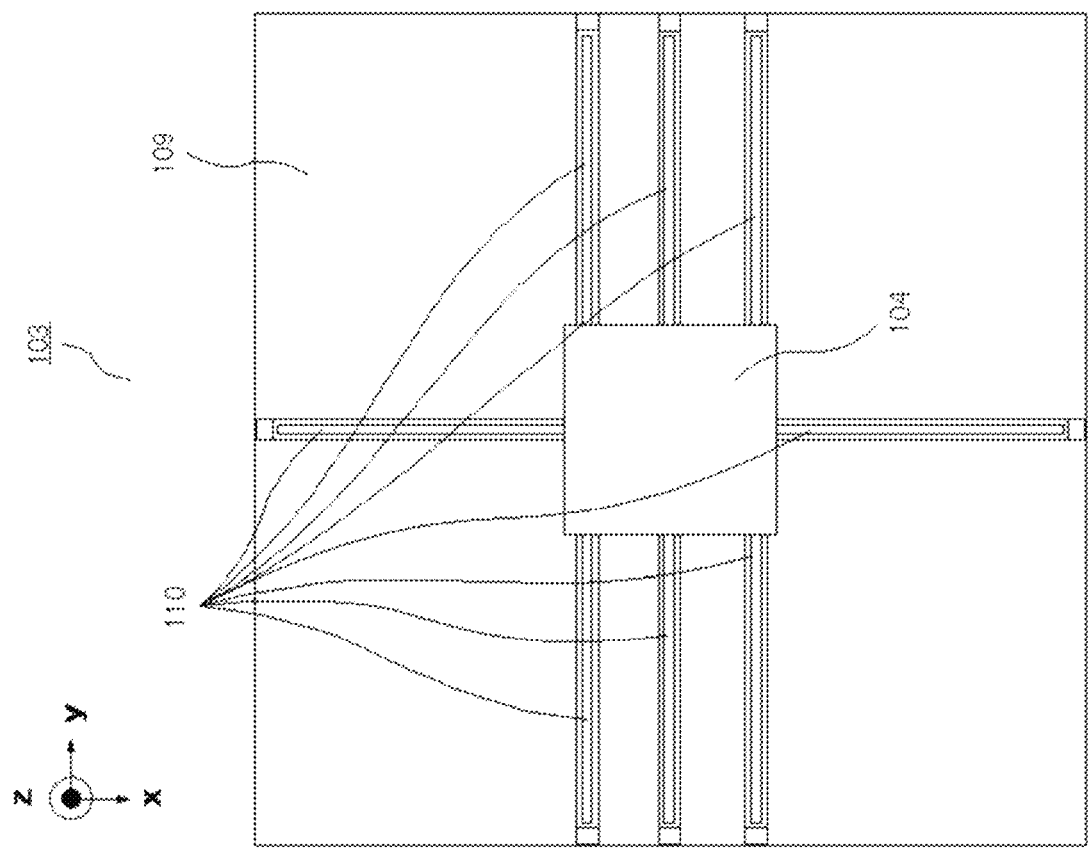
FIG. 2A is a diagram illustrating a top plan view of a PCB.
Figure 2B:
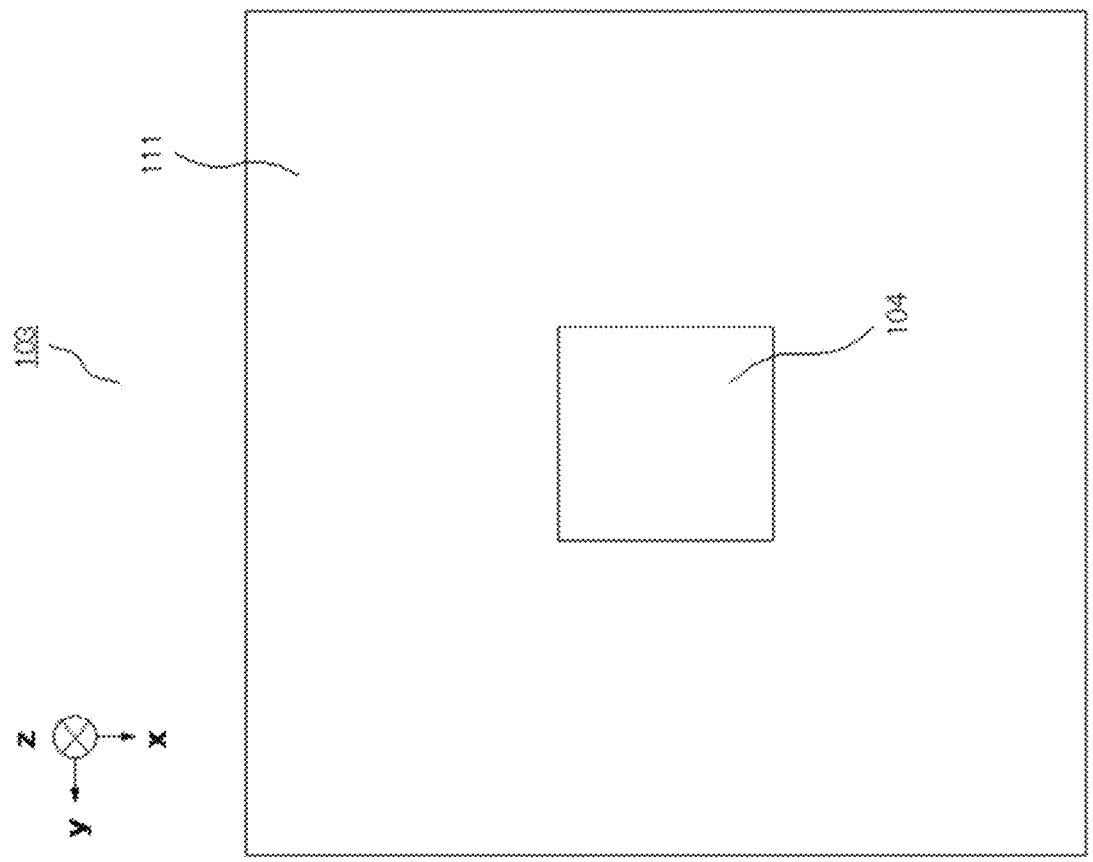
FIG. 2B is a diagram illustrating a bottom plan view of the PCB.
Figure 2D:
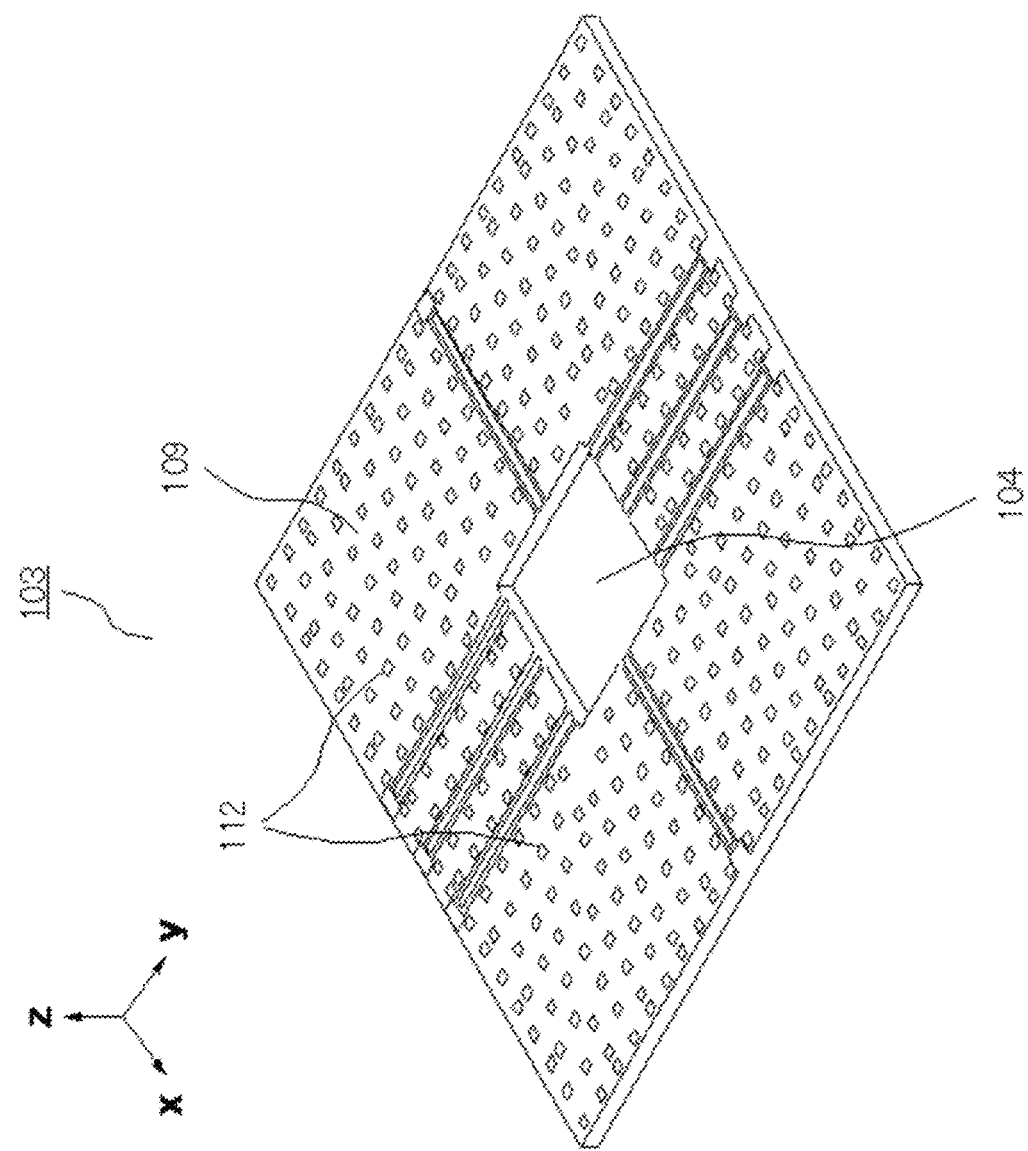
FIG. 2D is a diagram illustrating a perspective view of the PCB.
Figure 2E:
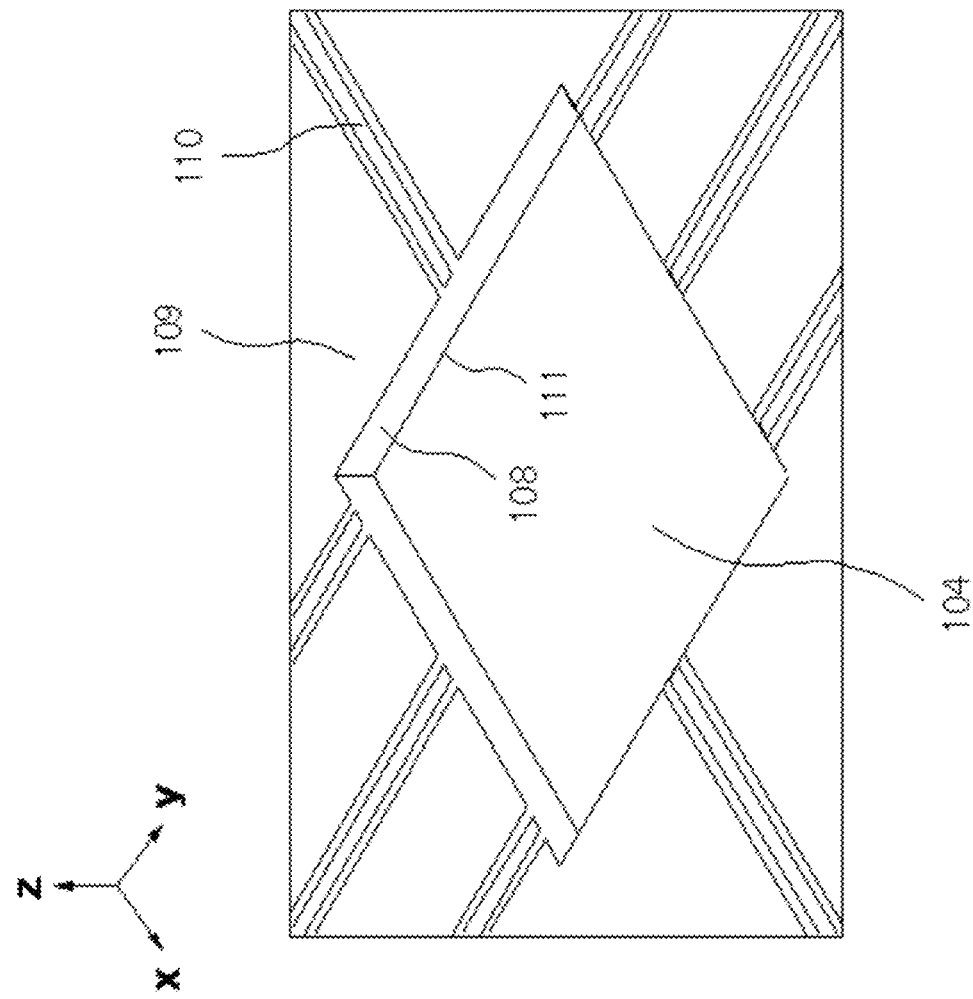
FIG. 2E is a diagram illustrating an enlarged view near a through opening of the PCB.

An example of the PCB 103 is illustrated in FIG. 2A to FIG. 2E. FIG. 2A and FIG. 2B are top plan and bottom plan views of the PCB 103 in FIG. 1A viewed from above and bottom. respectively. FIG. 2C is a side view of the PCB 103 in FIG. 1A viewed from y-axis. FIG. 2D is a perspective view of the PCB 103. FIG. 2E is a partial enlarged view near the through opening 104 of the PCB in FIG. 1A.

As illustrated in FIG. 2A to FIG. 2E, the PCB 103 has a structure in which a front surface GND 109 and core wires 110 of coplanar waveguides are formed on one side of a plate-shaped dielectric 108 extending parallel to an x-y plane and a rear surface GND 111 is formed on the other side of the dielectric 108.

The core wires 110, the front surface GND 109 and the rear surface GND 111 are conductors, e.g., metal. The coplanar waveguide is a waveguide that has a structure in which a conductor located in a center (hereinafter abbreviated as "central conductor") and two GND planes arranged via a gap on both sides of the central conductor in the xy-plane. The central conductor and the two GND planes are arranged on almost the same plane (xy-plane).

The two GND planes arranged on both sides of each core wire 110, which is a central conductor of the coplanar waveguide illustrated in FIG. 2A and FIG. 2E are formed by the front surface GND 109. In the PCB 103 illustrated in FIG. 2A to FIG. 2E, the coplanar waveguide is formed by forming front surface GNDs 109 with gaps in the xy-plane on both side surface of the core wire 110. In FIG. 2A to FIG. 2E, as a non-limiting example, the PCB 103 has, on its surface, total eight coplanar waveguides between side edges of the through opening 104 and outer side edges of the surface respectively opposed to the side edges of the through opening 104, i.e., two coplanar waveguides extending opposite to each other along x-axis direction, a first set of three coplanar waveguides extending along y-axis direction and a second set of three coplanar waveguides extending opposite to the first set along y-axis direction.

The PCB 103 has a plurality of through holes 112. These through holes 112 penetrates through the dielectric 108 and electrically connect the front surface GND 109 to the rear surface GND 111. Each of the through holes 112, for example, is fabricated by forming a hole penetrating through the dielectric 108, the front surface GND 109 and the rear surface GND 111 and then plating inside of the hole with metal.

In FIG. 1A and FIG. 1B, the rear surface GND 111 of the PCB 103 is, for an entire surface thereof, in contact with the pedestal 102. Therefore, the metal pedestal 102, the rear surface GND 111 of the PCB 103, the plurality of through holes 112 of the PCB 103, and the front surface GND 109 of the PCB 103 are electrically connected.

An opening surface of the through opening 104 provided around the center of the PCB 103 has, for example, a same planar shape as that of a chip with a superconducting quantum circuit to be mounted on the sample holder 101, i.e., a rectangular or square shape. An area of the through opening 104 is larger than that of the chip in order for the chip to be housed in the through opening 104 of the PCB 103.

Figure 3A:
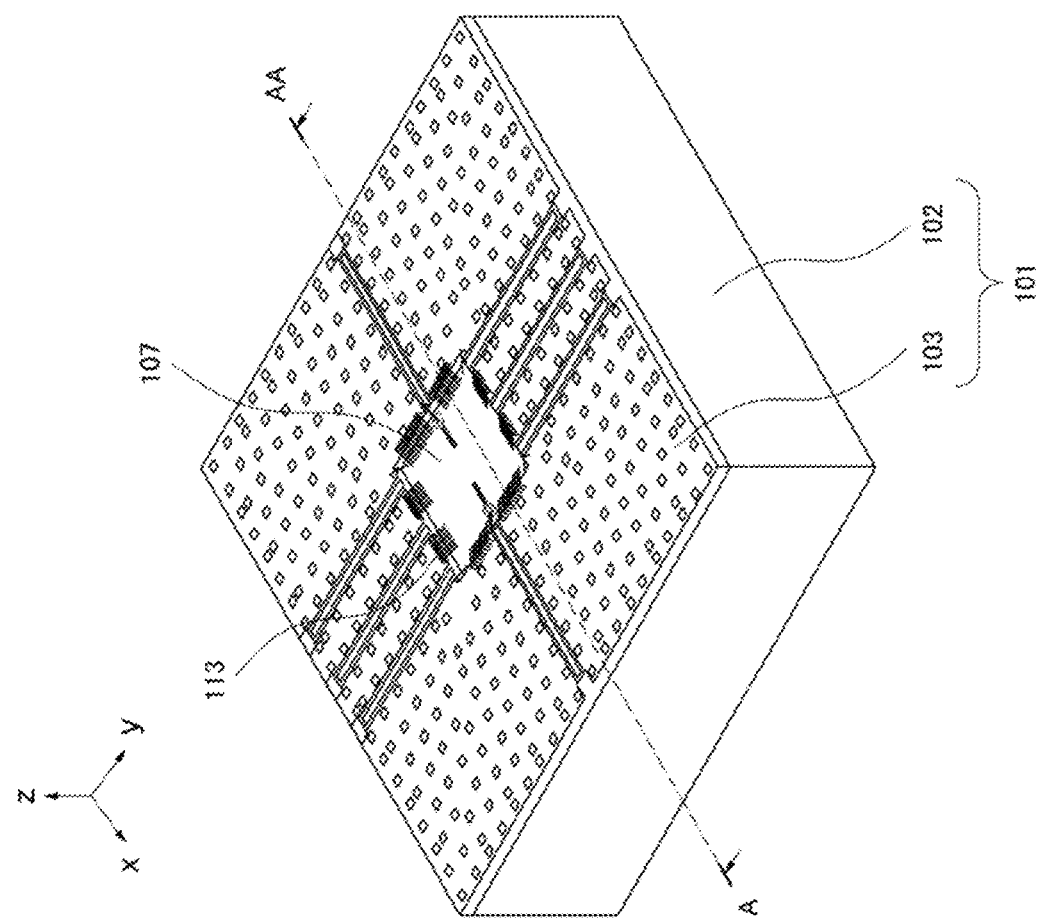
FIG. 3A is a diagram illustrating a perspective view illustrating a configuration when a chip with a superconducting quantum circuit is mounted on the sample holder illustrated in FIG. 1A and FIG. 1B.

FIG. 3A and FIG. 3B illustrate a configuration when a chip with a superconducting quantum circuit is mounted on the sample holder 101 illustrated in FIG. 1A and FIG. 1B. FIG. 3A is a perspective view illustrating a configuration when the chip 107 with the superconducting quantum circuit is mounted on the sample holder 101 illustrated in FIG. 1A and FIG. 1B. FIG. 3B is an end view illustrating an end face cut along a plane parallel to an x-z plane including a cutting line A-AA illustrated in FIG. 3A, which illustrates a configuration when the chip 107 with the superconducting quantum circuit is mounted on the sample holder 101 illustrated in FIG. 1A and FIG. 1B. In FIG. 3A and FIG. 3B, the PCB 103 described with reference to FIG. 2A to FIG. 2E is used as the PCB 103.

As illustrated in FIG. 3A and FIG. 3B, the chip 107 is housed in the through opening 104 of the PCB 103. The chip 107 housed in the through opening 104 is placed on the pedestal 102. Pads provided on a circuit surface of the chip 107 and the core wires 110 provided on a front surface of the PCB 103 are electrically connected using bonding wires 113 such as Al (aluminum). A GND (ground) plane (not shown) on the circuit surface of the chip 107 and the front surface GND 109 of the PCB are electrically connected using bonding wires 113. The pads on the chip 107 are signal input/output terminals (electrodes) formed on the circuit surface of the chip 107. In the example illustrated in FIG. 3A and FIG. 3B, the rear surface of the chip 107 (a bottom surface of the chip 107 in FIG. 3B) with an entire surface thereof is in contact with (in abutment to) the metal pedestal 102.

In the chip 107 mounted on the sample holder 101 as illustrated in FIG. 1A and FIG. 1B, resonance occurs when a signal having a specific frequency is supplied to the chip 107. To identify a cause of the chip-mode resonance, simulation using electromagnetic field analysis software was performed, using ANSYS (registered trademark) HFSS manufactured by ANSYS Japan K. K., though not limited thereto the same tool will be used in subsequent simulations.

Figure 4A:
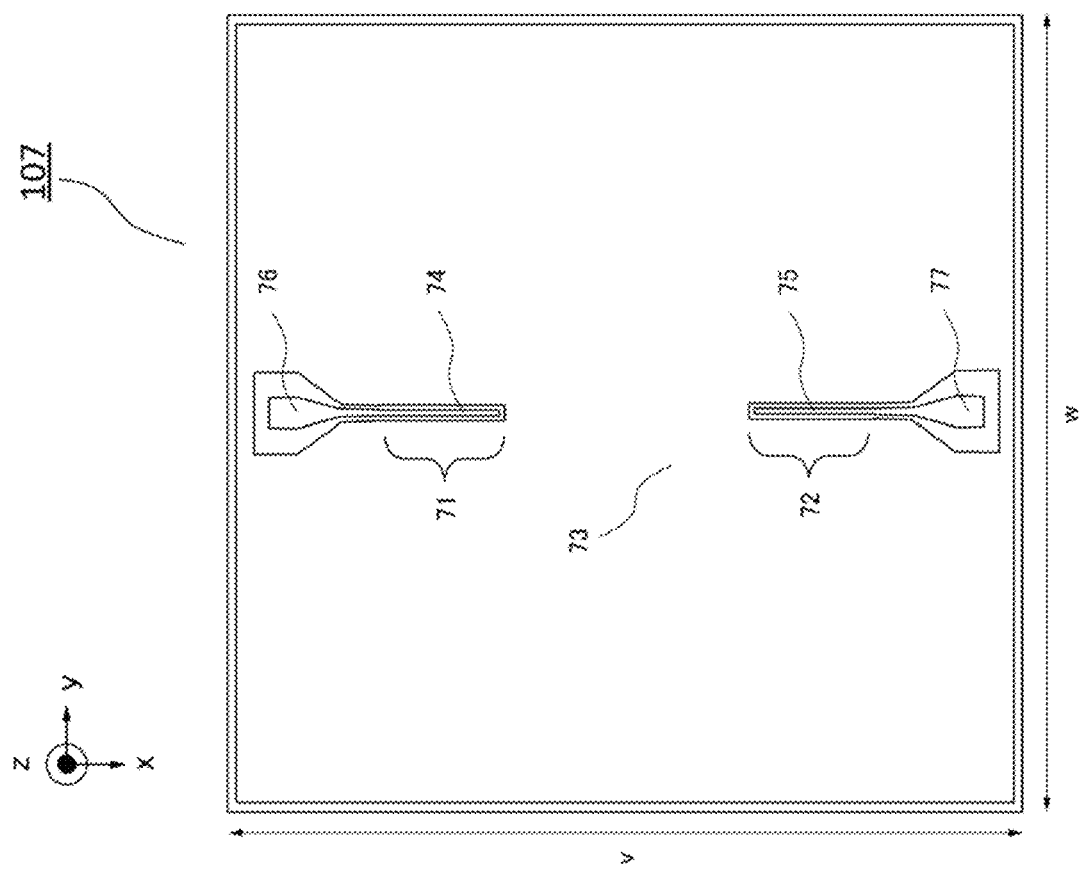
FIG. 4A is a diagram illustrating a top plan view of a chip used in a simulation.
Figure 4B:
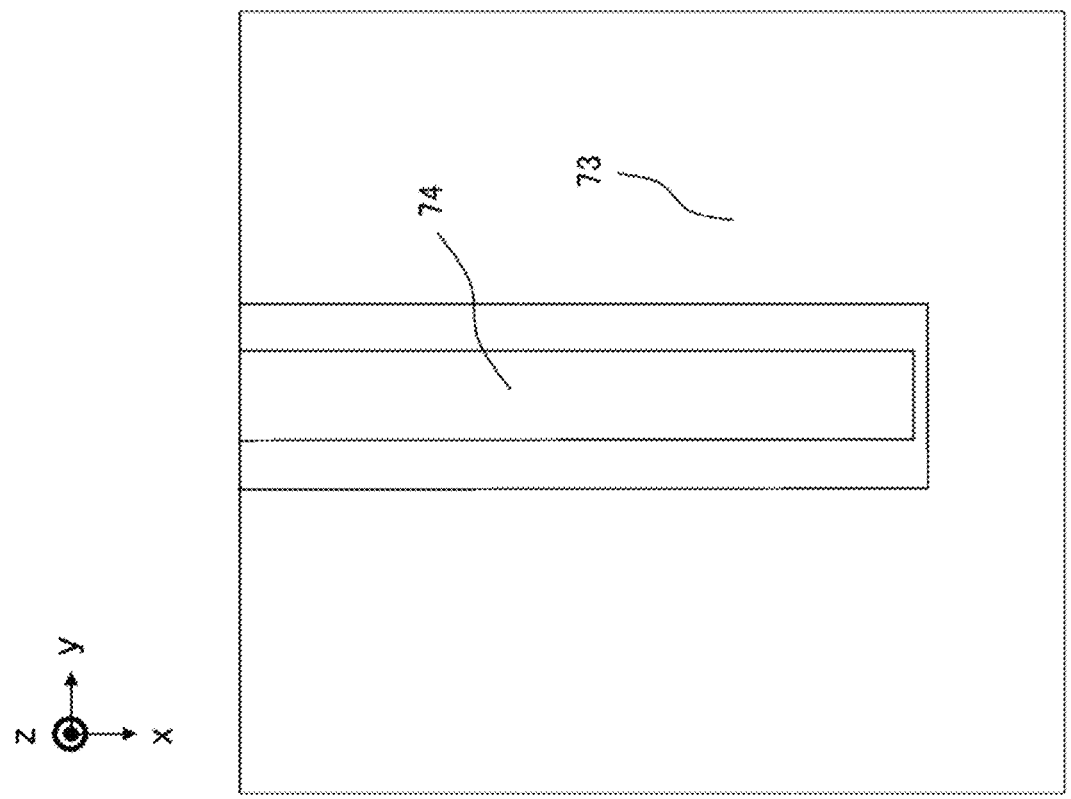
FIG. 4B is a diagram illustrating an enlarged view of a region near a tip of a first coplanar waveguide.

The chip 107 is illustrated in FIG. 4A and FIG. 4B. FIG. 4A is a top plan view of the chip 107 used in the simulation. FIG. 4B is a partial enlarged view of a region around a tip of a first coplanar waveguide 71 in FIG. 4A. As illustrated in FIG. 4A. the chip 107 has a planar shape of rectangular or square with lengths of vertical and lateral sides as v and w, respectively. In the following, the chip 107 used in the simulation is assumed to be of a square shape with the length of each side v=w=5 mm (millimeters). In the chip 107 used in the simulation, a circuit pattern is formed by depositing a metal film of 200 nm (nanometer) thickness on an entire surface of a silicon substrate of 380 μm (micrometer) thickness and removing predetermined portions (regions) of the metal film. Alternatively, a circuit pattern may be formed by coating a resist on a silicon substrate, patterning the resist, depositing a metal film on an entire surface with and removing the resist to form a metal pattern (circuit pattern) in regions where there is no resist.

In the chip 107 illustrated in FIG. 4A and FIG. 4B, a first coplanar waveguide 71 and a second coplanar wave guide 72 are opposed and extended along the x-axis direction, axisymmetric to the y-axis. The first coplanar waveguide 71 and the second coplanar waveguide 72 are identical in shape. A characteristic impedance of the first coplanar waveguide 71 and that of the second coplanar waveguide 72 are designed to be 50Ω and the lengths thereof are 1 mm.

A partial enlarged view of a region around the tip of the first coplanar waveguide 71 is illustrated in FIG. 4B. As illustrated in FIG. 4B, the tip of the first coplanar waveguide 71 is not in contact with the GND plane 73. As illustrated in FIG. 4A, the first coplanar waveguide 71 and the second coplanar waveguide 72 are not connected to each other. Similarly, the tip of the second coplanar waveguide 72 is not in contact with the GND plane 73. One end of a first core wire 74 is connected to a first pad 76, and one end of a second core wire 75 is connected to a second pad 77.

Figure 5A:
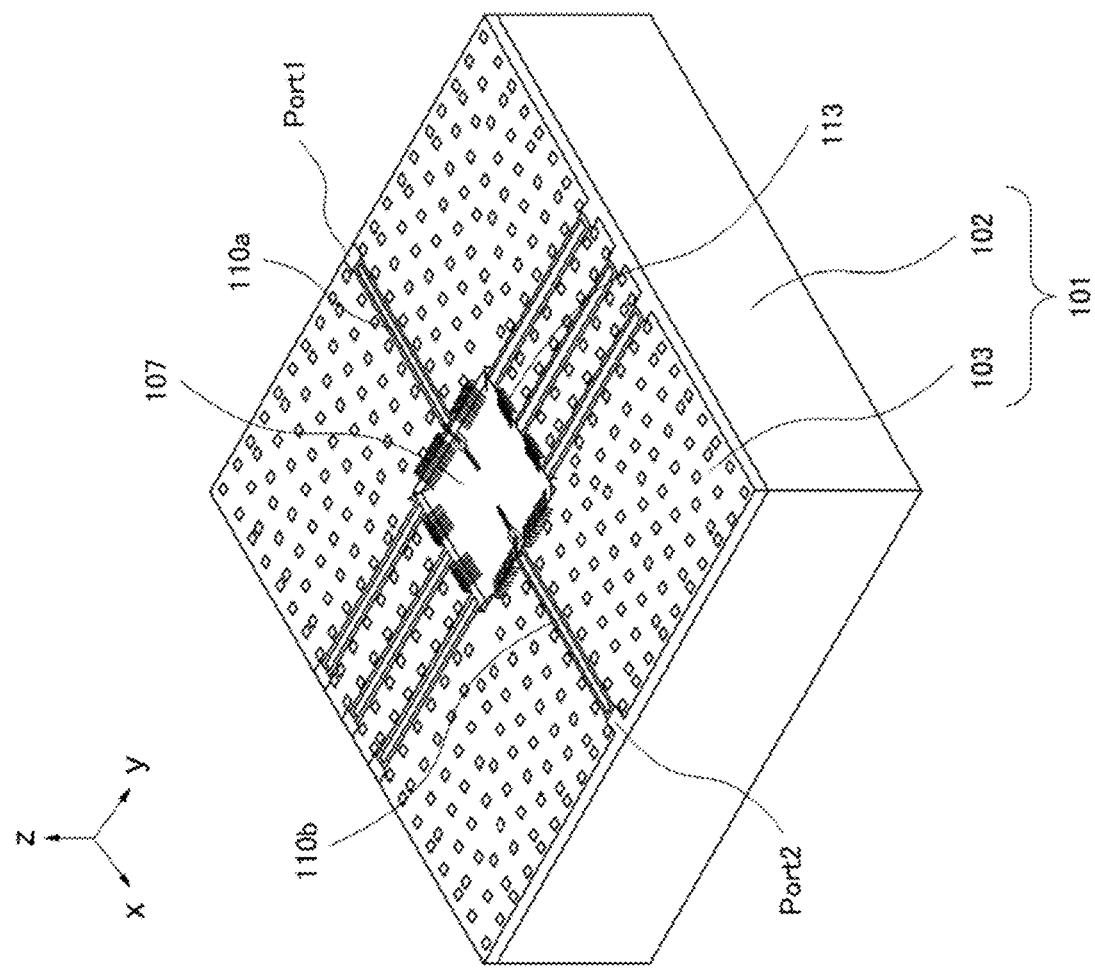
FIG. 5A is a diagram illustrating a perspective view illustrating an example of mounting the chip illustrated in FIG. 4A and FIG. 4B in the sample holder illustrated in FIG. 1A and FIG. 1B.
Figure 5B:
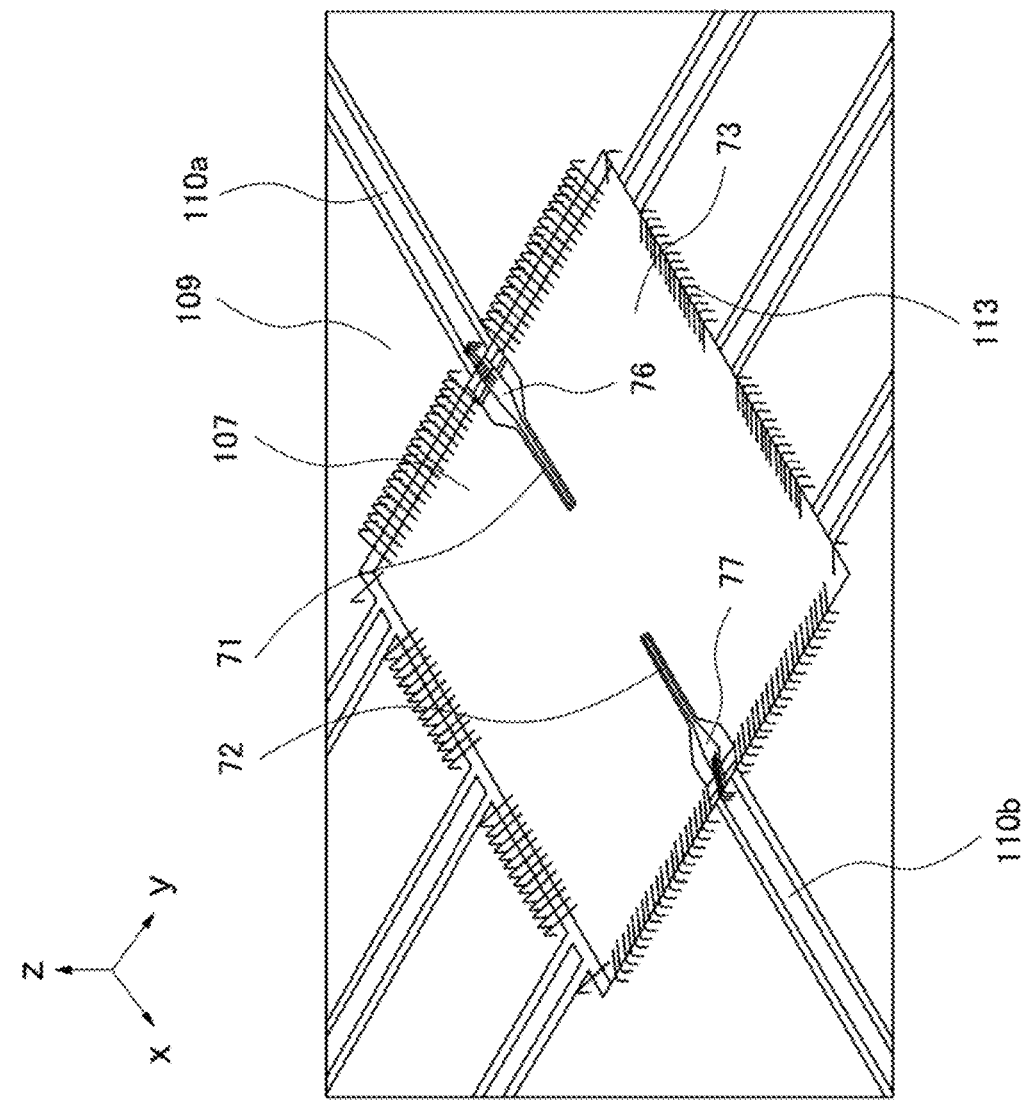
FIG. 5B is a diagram illustrating an enlarged view of a region near a chip.

FIG. 5A is a perspective view illustrating an example of mounting the chip 107 in FIG. 4A and FIG. 4B on the sample holder 101 in FIG. 1A and FIG. 1B. FIG. 5B is a partial enlarged view of a region around the chip 107 in FIG. 5A. As illustrated in FIG. 5A and FIG. 5B, the first pad 76 of the chip 107 is electrically connected to a first core wire 110a of the PCB 103 using bonding wires 113 of Al. The second pad 77 of the chip 107 is electrically connected to a second core wire 110b of the PCB 103 using bonding wires 113 of Al. The GND plane 73 of the chip 107 is electrically connected to the front surface GND 109 of the PCB 103 using bonding wires 113 of Al.

As illustrated in FIG. 5A, one end of the first core wire 110a of the PCB 103 is connected to the first pad 76 of the chip 107. The other end of the first core wire 110a of the PCB 103 constitute Port 1. One end of the second core wire 110b of the PCB 103 is connected to the second pad 77 of the chip 107. The other end of the second core wire 110b of the PCB 103 constitute Port 2. In the simulation, for example, a reflection at Port 1 and a transmission to Port 2 are computed when a high-frequency signal is supplied from Port 1. S11 denotes a reflection coefficient at Port 1 (an input reflection coefficient defined as a ratio of a signal reflected from Port 1 to the signal supplied to Port 1), and S21 denotes a transmission coefficient from Port 1 to Port 2.

Figure 6A:
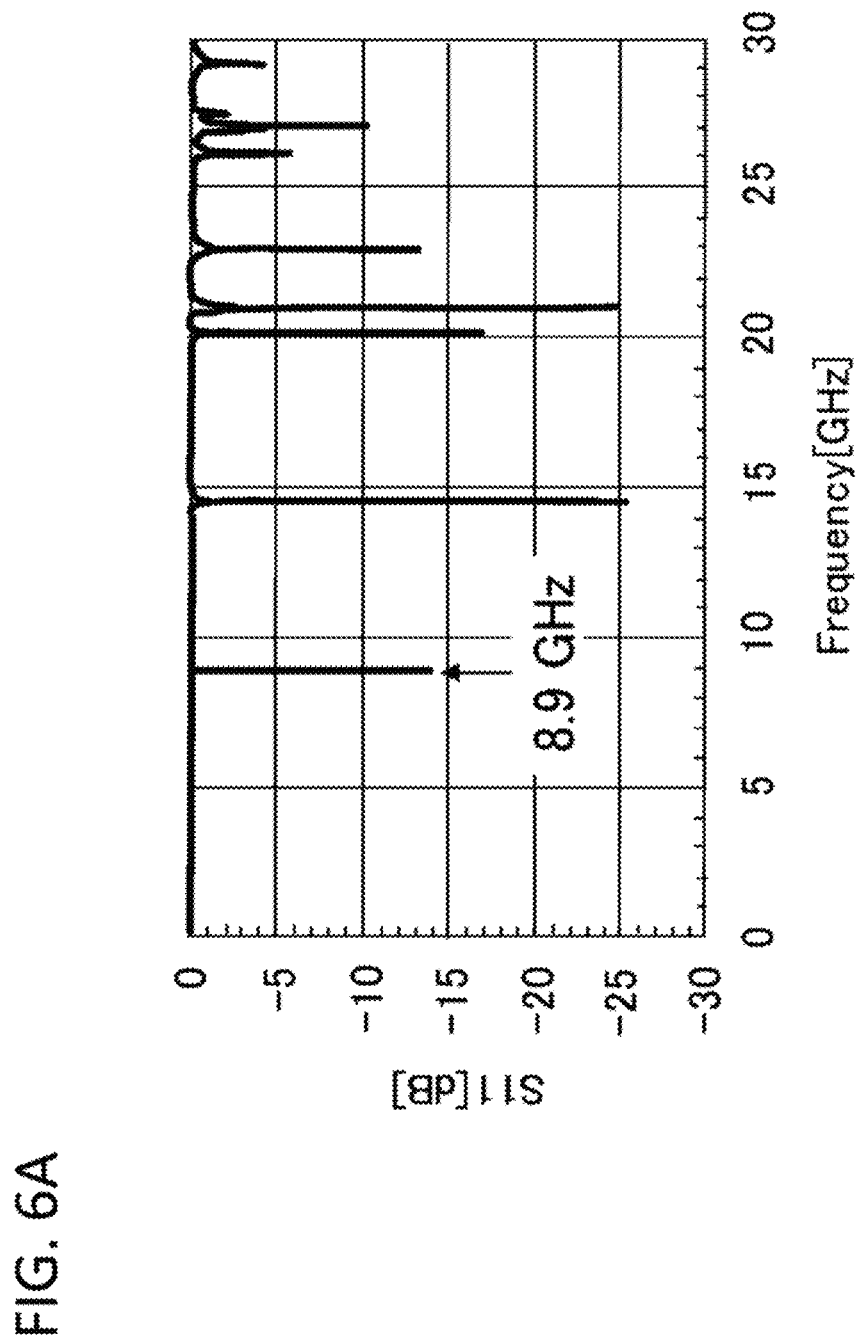
FIG. 6A is a diagram illustrating a refection to a port 1 (S11) when a high-frequency signal is inputted from the port 1.
Figure 6B:
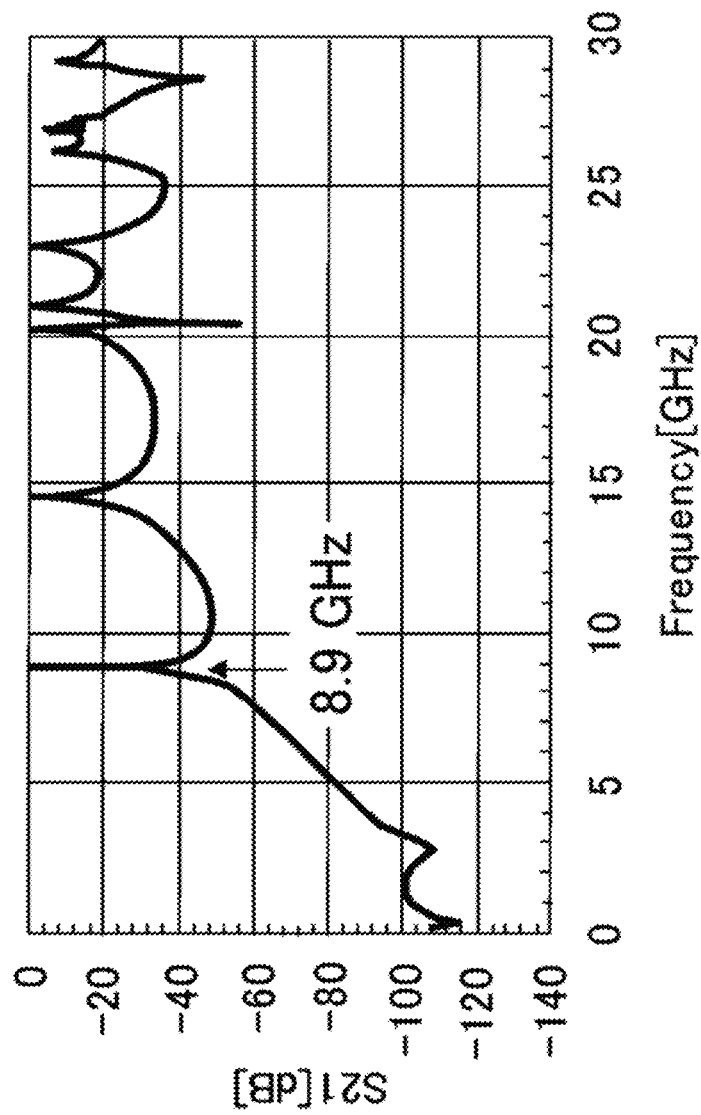
FIG. 6B is a diagram illustrating a transmission to a port 2 (S21) when a high-frequency signal is inputted from the port 1.

FIG. 6A is a diagram illustrating a refection coefficient (S11) at Port 1 when a high-frequency signal is supplied to Port 1 in FIG. 5A. FIG. 6B is a diagram illustrating a transmission coefficient (S21) at Port 2 when a high-frequency signal is supplied to Port 1. In FIG. 6A and FIG. 6B, a horizontal axis indicates frequency (unit [GHz (Giga Hertz]), and the unit of a vertical axes S11 and S21 is decibel (dB). S11 and S21 on the vertical axes are shown in logarithm. Note that also in the subsequent description of the simulation results, the horizontal axis is a frequency (unit [GHz]), and the vertical axes S11 and S21 are represented in decibels (dB).

As illustrated in FIG. 6A and FIG. 6B, when signals of several specific frequencies are supplied, S21 is extremely large and S11 is extremely small. As illustrated in FIG. 4A and FIG. 4B, the first coplanar waveguide 71 and the second coplanar waveguide 72 of the chip 107 are not connected to each other. Therefore, when a signal is supplied to Port 1, it is expected that the signal will not be transmitted to Port 2.

However, as a simulation result illustrated in FIG. 6B, when signals of several specific frequencies are supplied to Port 1, S21 is very large. For example, according to the simulation result illustrated in FIG. 6B, S21 is about −1.9 dB when a signal of 8.9 GHz is inputted from port (Port) 1. That is, about 65% of energy of the signal inputted from port (Port) 1 is transmitted to port (Port) 2. The simulation result illustrated in FIG. 6A indicates that S11 is very small at specific frequencies where S21 is very large.

The simulation results illustrated in FIG. 6A and FIG. 6B indicate the following. As illustrated in FIG. 5A and FIG. 5B, in the system in which the chip 107 with a superconducting quantum circuit is mounted on the sample holder 101, a space between the GND plane 73 on the surface of the chip 107 and the metal pedestal 102, i.e., a silicon substrate of the chip 107, forms (or functions as) a cavity resonator.

The first coplanar waveguide 71 and the second coplanar waveguide 72 of the surface (circuit surface) of the chip 107 couples with a cavity resonator (a silicon substrate of the chip 107). Therefore, when a signal with a frequency equal to a resonant frequency of the cavity resonator is supplied from Port 1 to the chip 107, a resonance of the cavity resonator is excited. Then, a standing wave is generated in the silicon substrate and an energy of an electromagnetic field is accumulated in the silicon substrate. Since the second coplanar waveguide 72 of the chip 107 couples with the cavity resonator, a part of the energy of the electromagnetic field accumulated in the silicon substrate transmits to Port 2 through the second coplanar waveguide 72 of the chip 107.

A phenomenon like this may occur in a system illustrated in FIG. 3A and FIG. 3B, regardless of a circuit type formed on the chip 107. It is not limited to the case where the coplanar waveguides 71 and 72 illustrated in FIG. 4A and FIG. 4B are formed on the chip 107 but even in such a case where that an arbitrary superconducting quantum circuit is formed on the chip 107, this kind of phenomenon may occurs. It is noted that in the present description, a resonance induced due to a fact that a structure in which a space between the GND plane 73 on the surface of the chip 107 and the metal pedestal 102 (in this case, the space being the silicon substrate) forms a cavity resonator in the mounting system illustrated in FIG. 3A and FIG. 3B, is included by the "chip-mode resonance" described above.

Hereinafter, each of several specific frequencies, at which S21 is very large and S11 is very small in the simulation results of FIG. 6A and FIG. 6B, is referred to as "chip-mode resonance frequency". When a signal with a frequency equal to or close to the chip-mode resonance frequency is supplied to the chip 107, a chip-mode resonance occurs.

According to the simulation results of FIG. 6A and FIG. 6B, the chip-mode resonance takes the lowest frequency at 8.9 GHz in the system of FIG. 5A and FIG. 5B. In the system of FIG. 3A and FIG. 3B (a system in which the chip 107 with a superconducting quantum circuit formed thereon is mounted on the sample holder 101 of FIG. 1A and FIG. 1B), a chip-mode, when coupled with a superconducting quantum circuit formed on the chip 107 induces decoherence of the superconducting quantum circuit as described above. It is known that the chip-mode resonance frequency needs to be as high as possible to reduce an influence of the decoherence. Therefore, a technology is needed to raise the chip-mode resonance frequency. As an example of such a technology, the aforementioned NPL 1 (in particular, FIG. 2 and related explanations) discloses that a part of the pedestal 102 directly under the chip 107 can be hollowed out to form a cavity, thereby reducing an influence of the chip-mode.

Figure 7A:
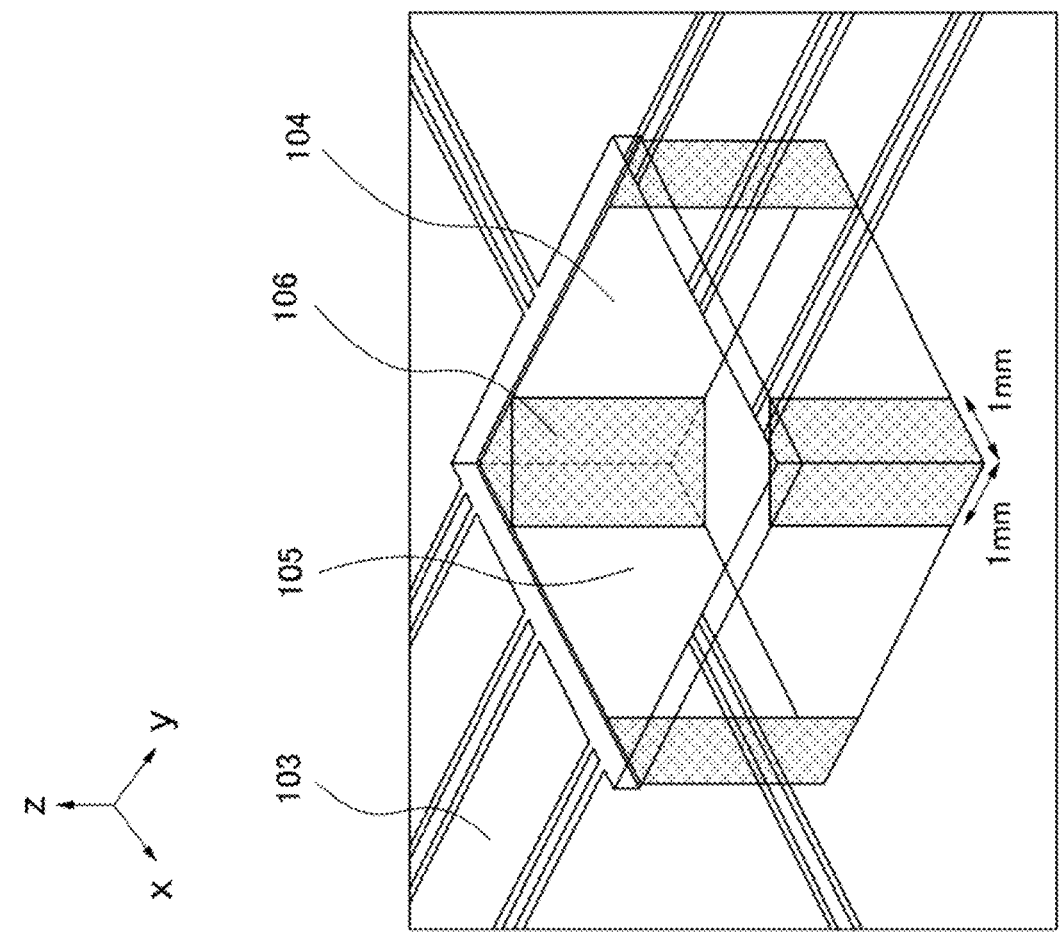
FIG. 7A is a perspective view illustrating a sample holder in which a cavity is formed in a pedestal.
Figure 7B:
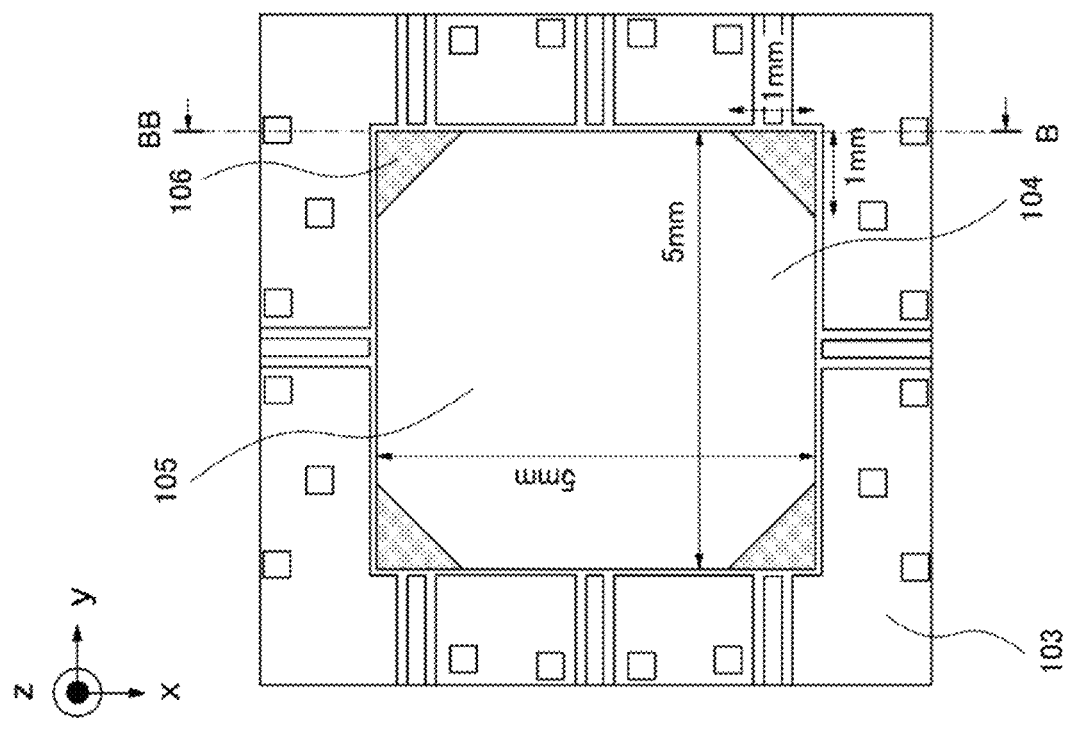
FIG. 7B is a top plan view illustrating the sample holder in which the cavity is formed in the pedestal.
Figure 7C:
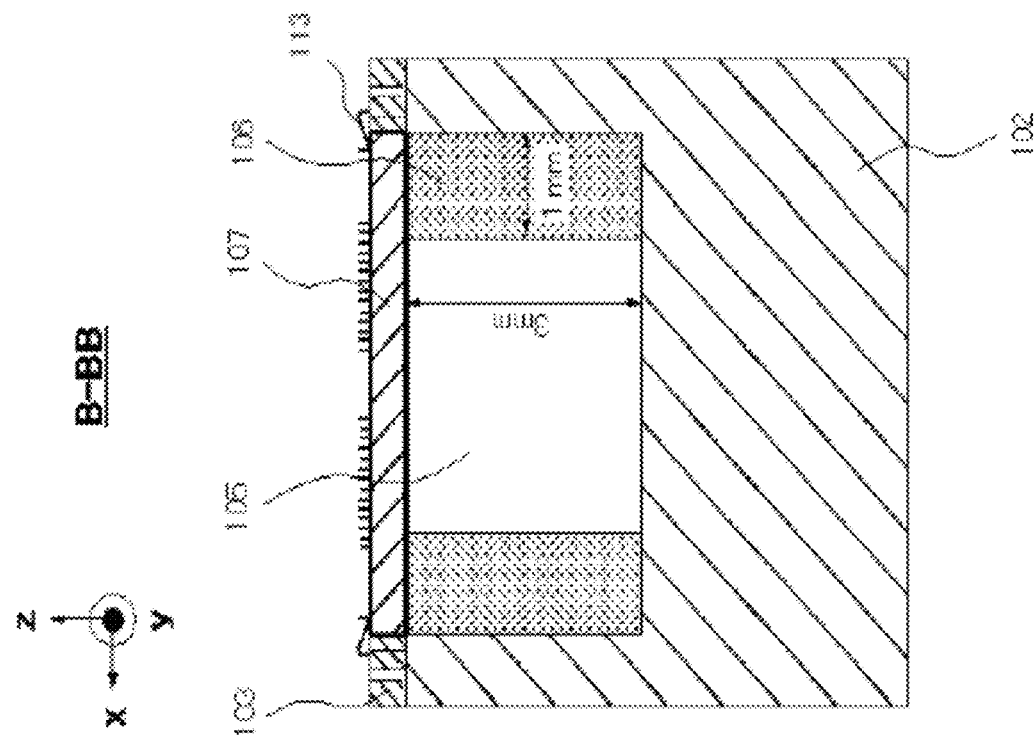
FIG. 7C is an end view of the sample holder in which the cavity is formed in the pedestal, cutting along a surface parallel to a x-z plane including a cutting line B-BB illustrated in FIG. 7B.

Partial enlarged views near the through opening 104 of the PCB 103 in the sample holder 101, in which a cavity similar to the cavity described in NPL 1 in the pedestal 102, are illustrated in FIG. 7A to FIG. 7C. FIG. 7A is a perspective view illustrating the sample holder 101 in which a cavity similar to the cavity described in NPL 1 is formed in the pedestal 102. FIG. 7B is a top plan view illustrating the sample holder 101 in which the cavity is formed in the pedestal 102. FIG. 7C is an end view of the sample holder 101 in which the cavity is formed in the pedestal 102, cutting along a surface parallel to a x-z plane including a cutting line B-BB illustrated in FIG. 7B. As illustrated in FIG. 7A to FIG. 7C, a cavity 105 is formed on the pedestal 102 at a location directly under the through opening 104 of the PCB 103. In other words, the pedestal 102 has the cavity 105 in a portion corresponding to directly under the chip 107 when the chip 107 is mounted on the sample holder 101 in FIG. 7A to FIG. 7C. The cavity 105 is in a shape of a quadrangular prism with a bottom (bottomed hollow quadratic (square) prism), in which an area of a top surface (opening) and an area of a bottom surface are equal to an area of the chip 107, in FIG. 7A to FIG. 7C. The pedestal 102 has a structure with four posts 106 left at four corners of the cavity 105. The posts 106 are made of metal, for example. It is noted that in the pads 76 and 77 of the chip 107 mounted on the sample holder 101, are connected to the first core wire 110a and the second core wire 110b of the PCB 103 using the bonding wires 113, respectively.

In FIG. 7A, FIG. 7B, and FIG. 7C, the posts 106 are shown in a different hatching pattern from the pedestal 102. This is to clearly illustrate the posts 106 in each of above drawings. The metal posts 106 at four corners are integrated with the pedestal 102, thus forming a part of the pedestal 102. Top surfaces of the metal posts 106 at four corners of FIG. 7A, FIG. 7B, and FIG. 7C are in contact with (abutting) a rear surface of the chip 107. As illustrated in FIG. 7A and FIG. 7B, each of the metal posts 106 has a shape of a triangle pole whose base is a right-angled isosceles triangle. Simulation was performed when the chip 107 illustrated in FIG. 4A and FIG. 4B is mounted on the sample holder 101 of FIG. 7A, FIG. 7B and FIG. 7C, where the length of two equal sides of the bottom surface of each of the posts 106 is 1 mm (millimeters (mm)) and the height of the cavity 105 is 3 mm, as illustrated in FIG. 7C.

Figure 8:
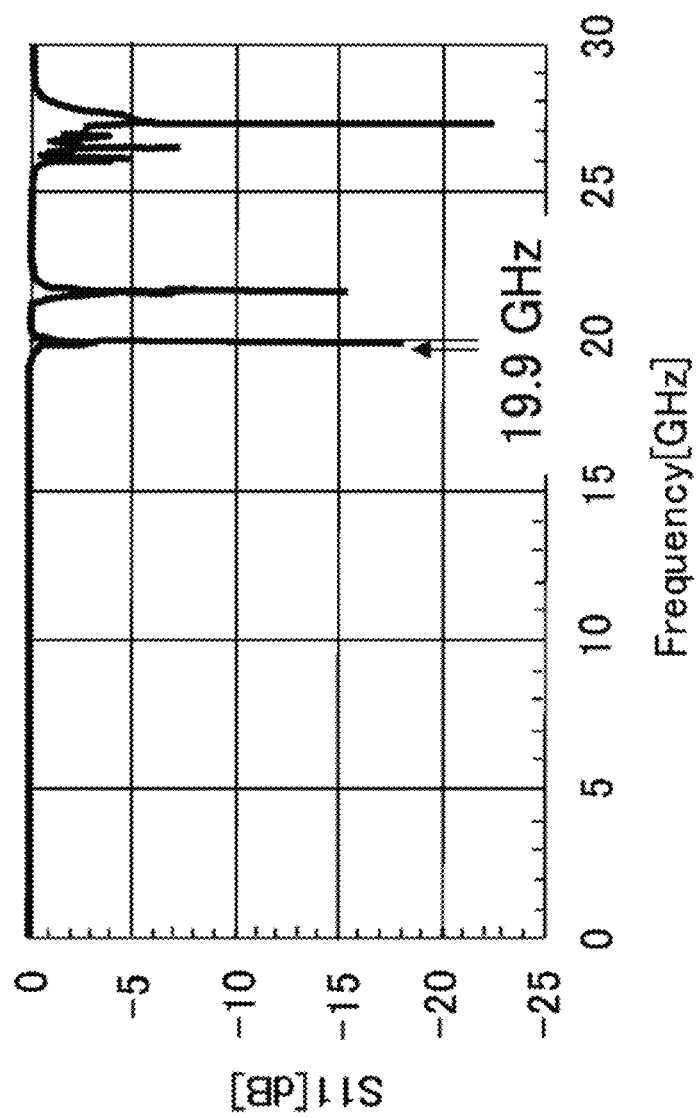
FIG. 8 is a diagram illustrating a simulation result of a reflection to the port 1 (S11) illustrated in FIG. 5A when high-frequency signal is inputted from the port 1, in case where the chip illustrated in FIG. 4A

FIG. 8 is a diagram illustrating a simulation result of a reflection to the Port) 1 (S11) show in FIG. 5A when a high-frequency signal is supplied from Port 1, in case where the chip 107 illustrated in FIG. 4A and FIG. 4B is mounted on (or connected to) the PCB 103 with the bonding wires 113, in the sample holder 101 illustrated in FIG. 7A, FIG. 7B and FIG. 7C. According to the simulation result illustrated in FIG. 8, when the chip 107 illustrated in FIG. 4A and FIG. 4B is connected to the PCB 103 with the bonding wires 113 to mount in the sample holder 101 with the cavity 105 illustrated in FIGS. 7A, 7B and 7C formed in the pedestal 102, it is found that the lowest chip-mode resonance frequency is enabled to be raised to as high as 19.9 GHz.

On the other hand, according to the simulation using the pedestal 102 in which the cavity 105 is not formed (as illustrated in FIG. 6A and FIG. 6B), the lowest chip-mode resonance frequency is 8.9 GHz.

This indicates that the chip-mode resonance frequency can be significantly raised by using the sample holder 101 with the cavity 105 formed in the pedestal 102, as illustrated in FIGS. 7A, 7B and 7C.

The reason why the chip-mode resonance frequency is enabled to be raised by forming a cavity in the pedestal 102 is inferred as follows. When the cavity 105 is formed at a portion directly under the chip 107 in the pedestal 102, inside the cavity resonator formed by a space between the GND plane 73 (see FIG. 4A, and FIG. 5B) on the surface of the chip 107 and the pedestal 102 (in this case, the bottom of the cavity 105), there exist a silicon substrate of the chip 107 (380 μm thick in the simulation) and a vacuum space (3 mm thick in the simulation), as illustrated in FIG. 7C. An effective dielectric constant inside the cavity resonator is reduced as compared with the case where the cavity 105 is not formed in the pedestal 102 (inside the cavity resonator, there exists almost only a silicon substrate of the chip 107).

While a relative dielectric constant $\varepsilon_r$ of vacuum is 1, a relative dielectric constant $\varepsilon_r$ of silicon is of such a high value as 11.9. In general, the lower a dielectric constant of a medium filling an inside of a cavity resonator, the higher a resonance frequency of the cavity resonator tends to be.

Thus, the sample holder 101 with the cavity 105 formed in the pedestal 102 can be used to raise the chip-mode resonance frequency. However, in order to reduce an influence of the chip-mode resonance on a superconducting quantum circuit, it is required that the chip-mode resonance frequency is as high as possible. As the number of quantum bits (or qubits) to be integrated in the chip 107 increases for the practical application of a quantum computer, it is predicted that the chip 107 with an area larger than 5 mm×5 mm, for example, will be required.

The larger an area of the chip 107, the lower the chip-mode resonance frequency. This is because the larger the area of the chip 107, a size (area) of the bottom surface of the cavity resonator formed by a space between the GND plane 73 on the surface of the chip 107 and the pedestal 102 becomes larger. Therefore, it is expected that even with the sample holder 101 having the cavity 105 formed in the pedestal 102 as illustrated in FIG. 7A to FIG. 7C, the larger the area of the chip 107, the lower the chip-mode resonance frequency and the greater an influence on the superconducting quantum circuit. In light of the above, there is need to develop a technique that can further raise the chip-mode resonance frequency as high as possible, compared to the case of using the sample holder 101 with the cavity 105 formed in the pedestal 102 as disclosed in NPL 1.

Several example embodiments enabling to realize a chip-mode resonance frequency higher than the technique disclosed in the NPL 1 will be described.

First Example Embodiment

In a first example embodiment, an example configuration will be described in which a PCB in contact with (arranged on) a pedestal, includes a dielectric, a front surface GND formed on a front surface of the dielectric, a rear surface GND formed on a rear surface of the dielectric, and a through opening (through opening part) to penetrate through from the front surface GND to the rear surface GND, with the chip accommodated in through opening. In the first example embodiment, an example that there is a cavity in at least a part of the pedestal below the through opening, and the cavity is provided with a support structure that supports a surface of the chip and is conductive to the pedestal will be described.

Figure 9:
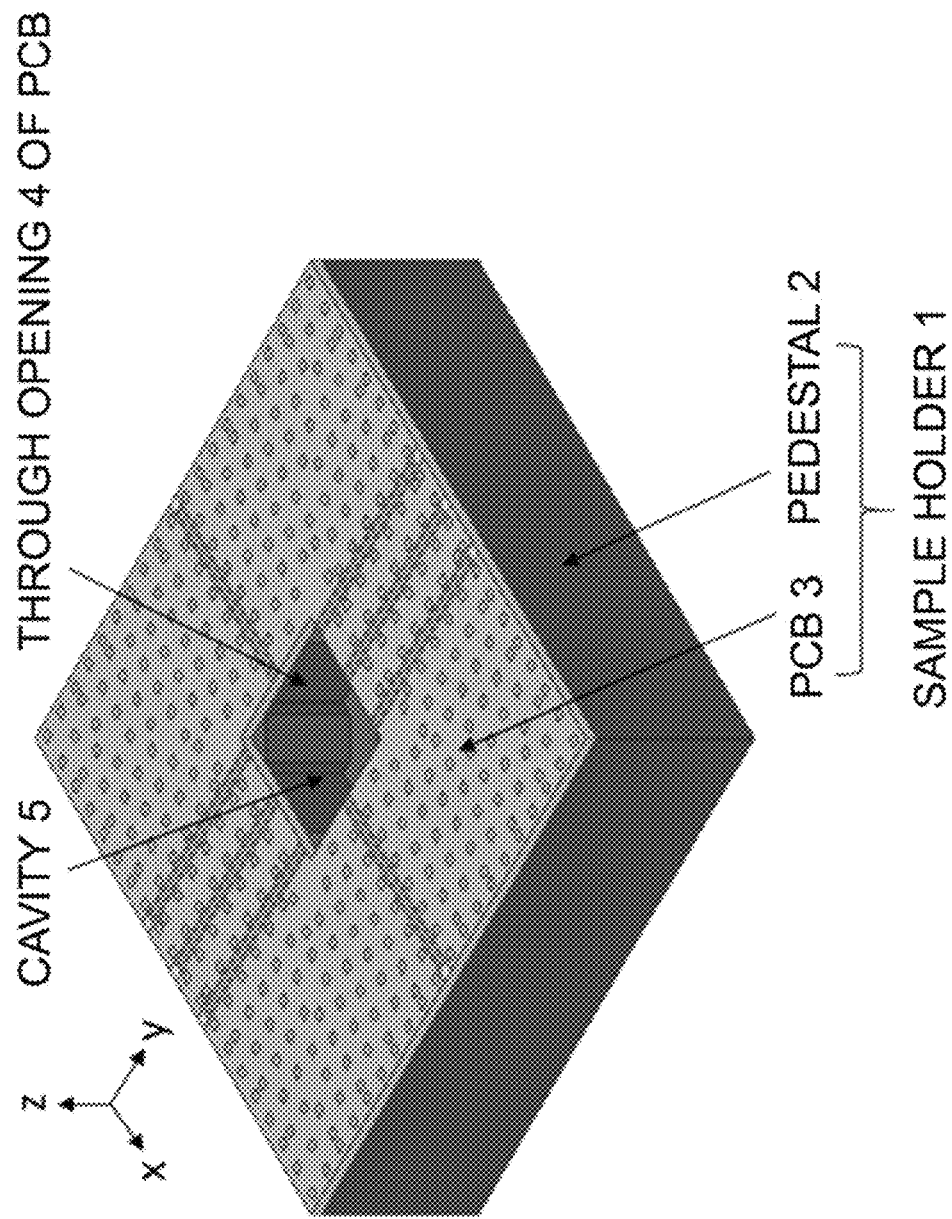
FIG. 9 is a diagram illustrating a sample holder according to a first example embodiment.

FIG. 9 is a diagram illustrating a sample holder according to the first example embodiment. Referring to FIG. 9, in the first example embodiment, a sample holder 1 has a configuration in which a PCB 3 is mounted on a metal pedestal 2. A through opening 4 (a through opening part) penetrating through the PCB 103 is formed near the center of the PCB 3. The pedestal 2 may have a rectangular or cubic shape, though not limited thereto. In the sample holder 1, a cavity 5 is provided at a portion of the pedestal 2 directly under the through opening 4 of the PCB 3.

By aligning a height of a circuit surface of a chip (not shown), with a height of a surface of the PCB 3 as much as possible, wire bonding can be made easier, and a length of a bonding wire can be made shorter. The shorter the bonding wire, the more improved electrical characteristics. By forming the through opening 4 in the PCB 3, a chip-mode resonance frequency is enabled to be raised. When a dielectric or a conductor is present on a rear surface (opposite to the circuit surface) of a chip (not shown), the chip-mode resonance frequency will decrease. Therefore, in the first example embodiment, the rear surface of the chip is configured to contact with a vacuum as much as possible in order to increase the chip-mode resonance frequency.

Should the chip be placed on a PCB 3 without forming the through opening 4, the dielectric or the conductor of the PCB 3 would be in contact with the rear surface of the chip. Therefore, the chip-mode resonance frequency cannot be raised.

In the first example embodiment, the through opening 4 is formed in the PCB 3, the chip is placed in the through opening 4, and a cavity 5 is formed in the pedestal 2 directly under the chip. Thus, the sample holder 1 has such a structure that as large an area as possible of the rear surface of the chip is in contact with a vacuum.

Figure 10A:
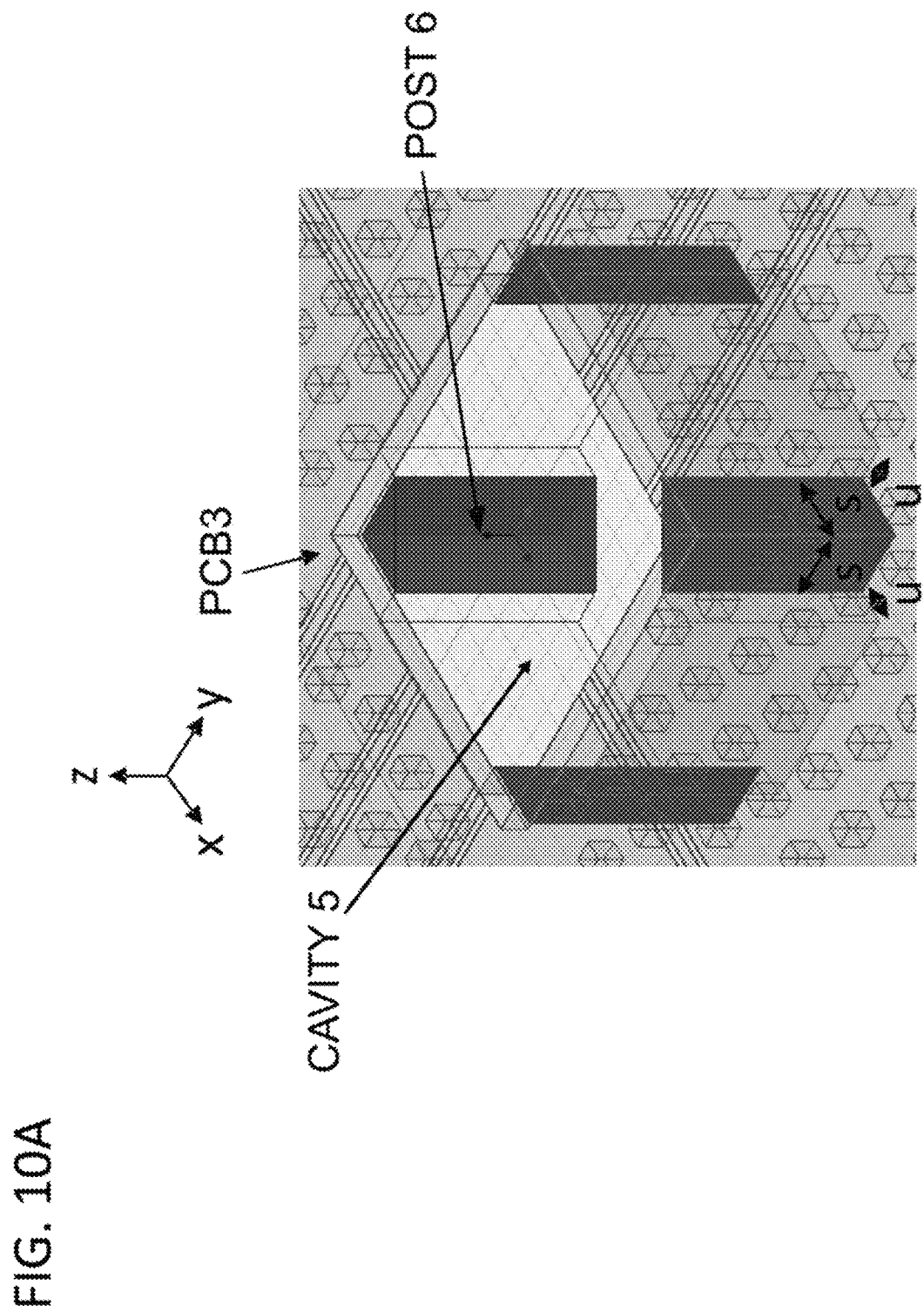
FIG. 10A is a perspective view illustrating the sample holder according to the first example embodiment.
Figure 10B:
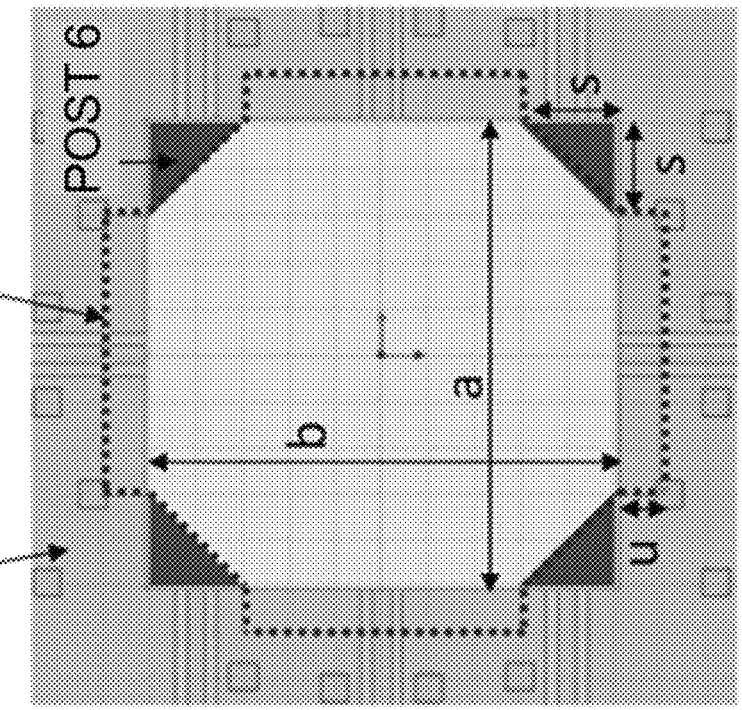
FIG. 10B is a diagram illustrating a top plan view of the sample holder according to the first example embodiment.
Figure 10C:
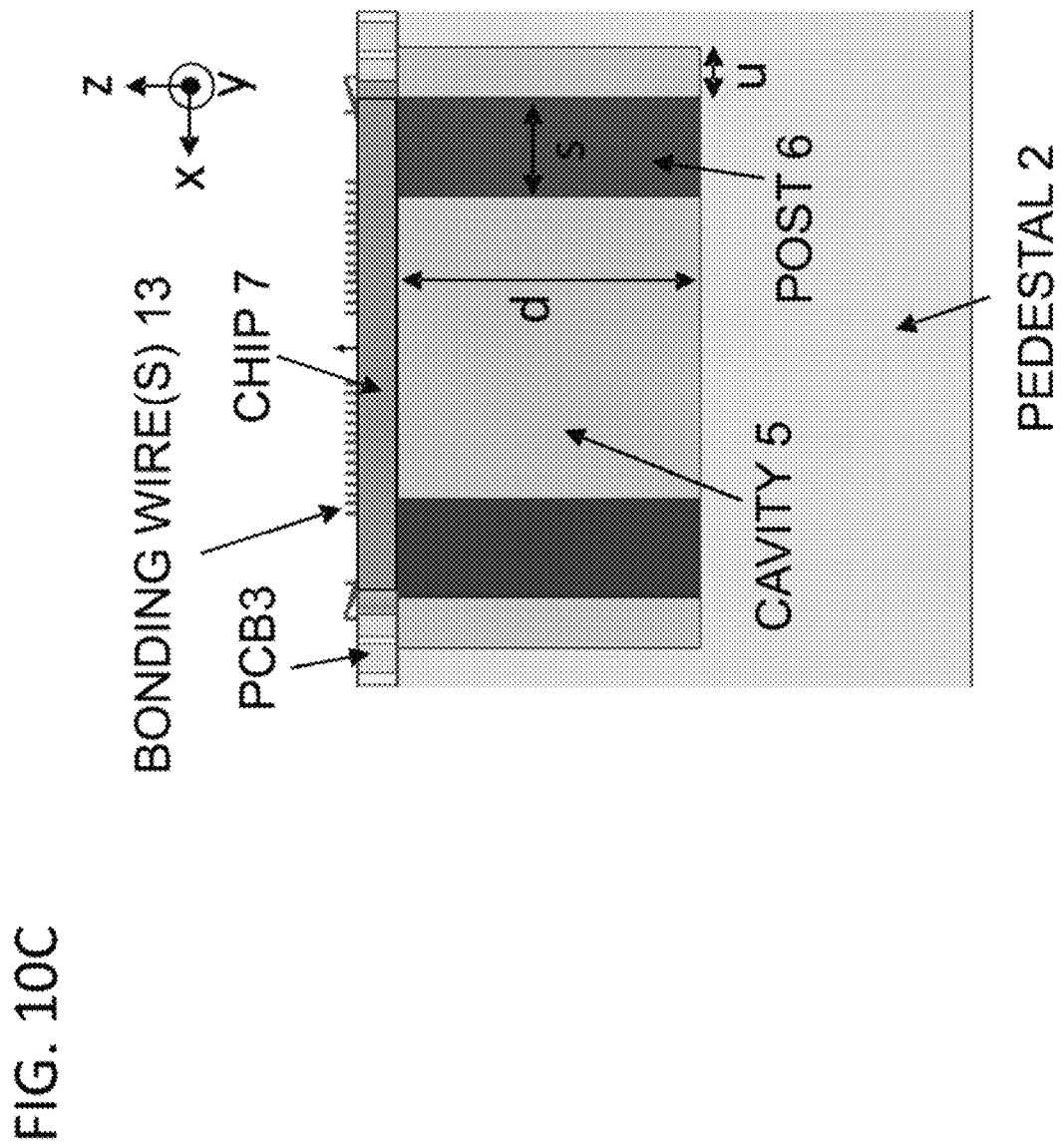
FIG. 10C is a diagram illustrating a see-through view from a positive direction of the y-axis of the sample holder according to the first example embodiment.

Partial enlarged views near the through opening 4 on the PCB 103 of the sample holder 1 according to the first example embodiment are illustrated in FIG. 10A to FIG. 10C. FIGS. 10A and 10B are perspective and top plan views illustrating the sample holder 1 of the first example embodiment. FIG. 10C is a see-through view from a positive direction of the y-axis of the sample holder 1 of the first example embodiment. Referring to FIG. 10C, a chip 7 is mounted on the sample holder 1 by connecting a pad of the chip 7 to the PCB 3 of the sample holder 1 using bonding wires 13 (wire bonding mounting).

In the sample holder 1, the cavity 5 is formed on at least a part of the pedestal 2 below the through opening 4 of the PCB 3. That is, in FIG. 10A to FIG. 10C, the sample holder 1 include the cavity 5 in a portion of the pedestal 2 corresponding to directly under the chip 7 mounted with bonding wires 13 on the sample holder 1.

In the present example embodiment, the cavity 5 formed in the pedestal 2 differs from the cavity 5 of NPL 1 described with reference to FIG. 7A, FIG. 7B, FIG. 7C, etc., in that a part of four side walls of the cavity 5 are extended outward by a length u. Therefore, in the present example embodiment, the cavity 5 has a cruciform planar shape viewed from a surface side of the PCB 103 (positive direction of the z-axis) as shown by dashed lines in FIG. 10B. In other words, a bottom of the cavity 5 has a substantially cruciform planar shape. Seen from the surface side of the PCB 103 (positive direction of the z-axis), a part of each of four sides (excluding parts of posts 6 at the four corners) of the bottom surface of the cavity 5 (refer to the cavity 5 indicated by dashed lines in FIG. 10B) protrudes outward by a length u from an area where the chip 7 is placed. That is, the cavity 5 of the pedestal 2 has a region (indicated by dashed lines in FIG. 10B) projecting outward by a length u with respect to each side connecting two adjacent corners of the through opening 4 (square or rectangle) of the PCB 3. This region corresponds to a region between sides (equal sides: length s) of two adjacent posts 6 (isosceles triangles in cross-sectional shape).

When dimensions of the chip 7 to be mounted on the sample holder 1 is v×w, dimensions a and b indicated for the cavity 5 of FIG. 10B, can be, for example, a=v and b=w, respectively. There is a support structure (posts 6 in FIG. 10A to FIG. 10C) directly under the through opening 4. The support structure supports a rear surface of the chip 7 and is conductive to the pedestal 2. A material of the support structure is, for example, a metal. The material of the posts 6 (support structures) may be, for example, a mixture including metal, such as a resin mixed with metal grains or fillers. As illustrated in FIG. 10A and FIG. 10B, each of the support structures may have a shape of a triangle pole whose bottom surface has a shape of a right-angled isosceles triangle.

There is no specific limitation to the shape of the support structure. For example, the support structure may be a post 6, in FIG. 10A to FIG. 10C. The support structure, for example, may be a protrusion part that protrudes from a side surface of the cavity 5 to inside of the cavity 5 and extends from a front to a back of the cavity 5, although not shown.

One example that the posts 6 illustrated in FIG. 10A to FIG. 10C are used as the support structures will be described. There is no specific limitation to the number and shape of the post 6. In FIG. 10A to FIG. 10C, a plurality of posts 6 are provided directly under the through opening 4. More specifically, the posts 6, which are conductors, are placed directly under the through opening 4.

In FIG. 10A to FIG. 10C, the posts 6 are shown in a different gradation from the pedestal 2 to clearly show the posts 106. As illustrated in FIG. 10A to FIG. 10C, a bottom surface of each of the posts 106 has a shape of a right-angled isosceles triangle. The length of two equal sides of the bottom surface of each of the posts 6 is s. The height of each of the post 6 is d. Each of the posts 6, whose bottom surface is a right-angled isosceles triangle, is in contact with each of the four corners of the cavity 5, whose opening part is rectangular in shape (square or rectangular), at a point corresponding to its top corner. In other words, the posts 6 of conductor is electrically in contact with the pedestal.

In FIG. 10A to FIG. 10C, four conductor posts 6 may be a separate unit from the pedestal 2. Alternatively, in FIG. 10A to FIG. 10C, the posts 6 may be of the same material as the pedestal 2. In this case, for example, the pedestal 2 and the posts 6 may be of one piece. When a chip 7 is mounted on the sample holder 1 with bonding wires 13, a top surface of each of the four posts 6 is in contact with (abut) each of the four corners of the rear surface (square or rectangular) of the chip 7.

The following describes an effect of the posts 6. Without the posts 6, there is a concern that the chip 7 may fall into the cavity 5. The chip 7 and the PCB 3 are connected using bonding wires, therefore, basically the chip 7 does not fall into the cavity 5, even without the posts 6. However, there is a possibility that the chip 7 may fall into the cavity 5 due to vibration etc., or the chip 7 may fall into the cavity 5 due to some bonding wires coming off. The metal posts 6 can prevent the chip 7 from falling into the cavity 5 and prevent the bonding wires from coming off.

The metal posts 6 can also strengthen a thermal path between the chip 7 and the pedestal 2. The chip 7 of the superconducting quantum circuit is cooled to an extremely low temperature (cryogenic temperature) of about 10 [mK], for example, by a refrigerator to operate. Generally, the pedestal 2 is in thermal contact with a cold stage of the refrigerator (where it is coldest). That is to say, the pedestal 2 is at an extremely low temperature. The stronger the thermal path (thermal conduction path) between the pedestal 2 and the chip 7, in other words, the smaller the thermal resistance between the pedestal 2 and the chip 7, the better the chip 7 is cooled.

If the chip 7 is not cooled to extremely low temperature, a good performance of the quantum circuit formed on the chip 7 cannot be extracted. Therefore, it is desirable to cool the chip 7 to a temperature as low as possible. That is, a thermal resistance between the pedestal 2 and the chip 7 is desirable to be as small as possible. Here, the metal posts 6 reduce the thermal resistance between the pedestal 2 and the chip 7.

To enhance the thermal conductive path between the chip 7 and the pedestal 2 most, for example, there could be conceived a structure with no cavity 5 in the pedestal 2. However, in the case where the cavity 5 is not formed in the pedestal 2, there is a problem of chip-mode resonance. In order to solve the chip mode problem, when forming the cavity 5 in the pedestal 2, a part of a top surface of each of the posts 6 placed in the cavity 5 is configured to be parallel to the rear surface of chip 7. In other words, in the support structure placed within the cavity 5, at least a part of the portion that support the chip 7 is parallel to the rear surface of the chip 7. Each of the top surfaces of the four posts 6 has an abutting surface for abutting in a surface contact with corresponding region of each of the four corners of the rear surface (square or rectangular) of the chip 7. This can reduce the thermal resistance between the pedestal 2 and the chip 7.

The PCB 3 used in the present example embodiment is the same as the PCB 3 described with reference to the FIG. 2A to FIG. 2E. FIG. 11A to FIG. 11E correspond to FIG. 2A to FIG. 2E, respectively. FIGS. 11A, 11B, 11C, 11D are top plan, bottom plan, side and perspective views of the PCB 3 used for the sample holder 1 according to the first example embodiment. FIG. 11E is an enlarged view near a through opening of the PCB 3 used for the sample holder 1 according to the first example embodiment.

Figure 11A:
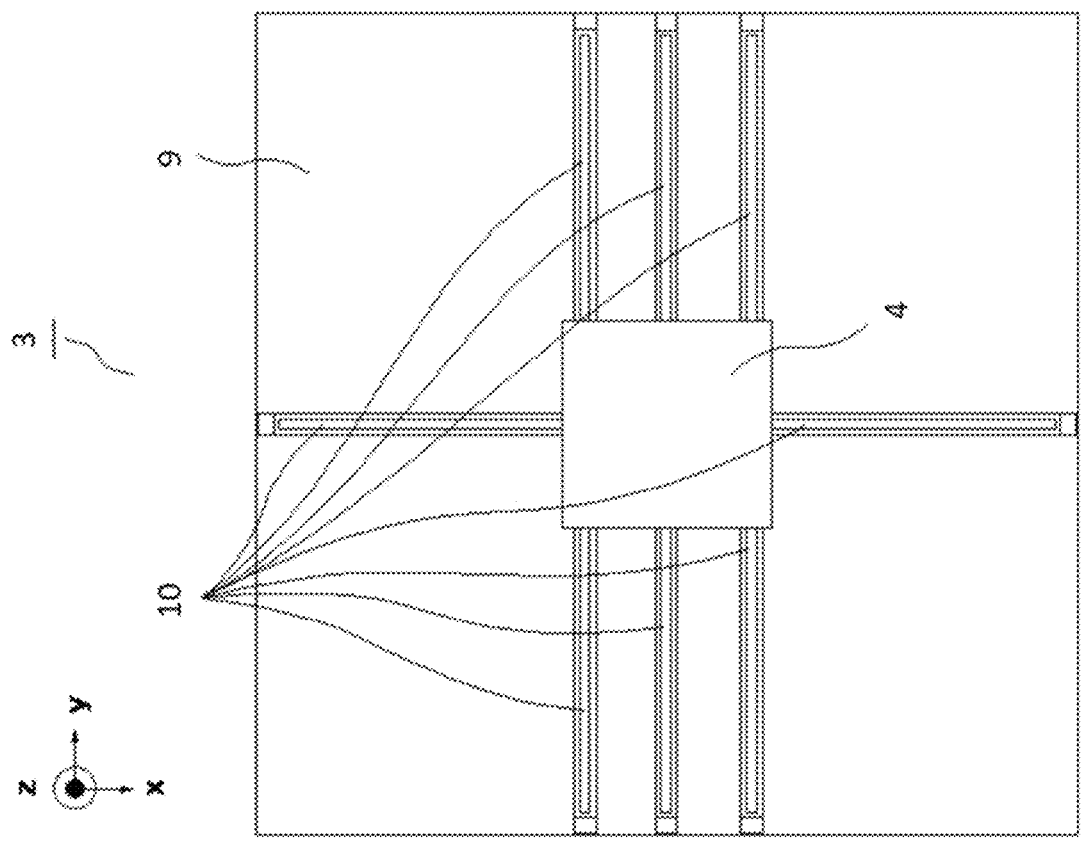
FIG. 11A is a diagram illustrating a top plan view of a PCB used for the sample holder according to the first example embodiment.
Figure 11B:
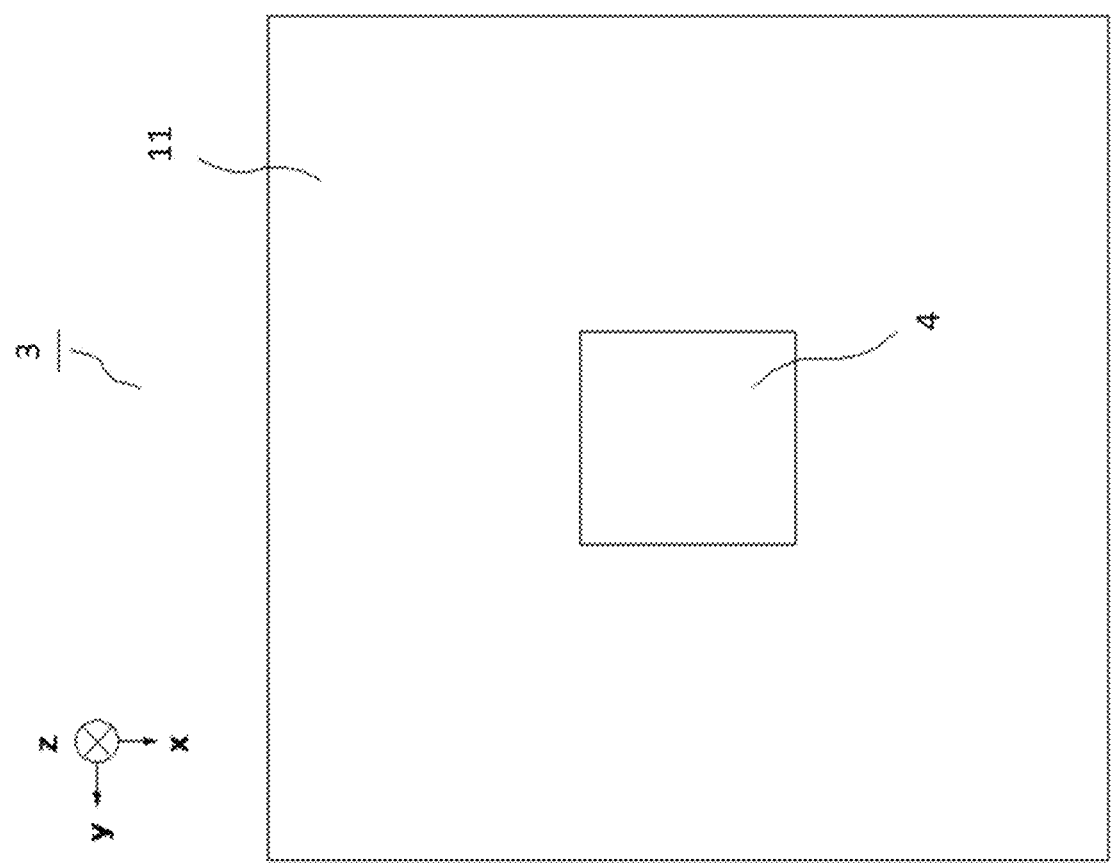
FIG. 11B is a diagram illustrating a bottom plan view of the PCB used for the sample holder according to the first example embodiment.
Figure 11C:
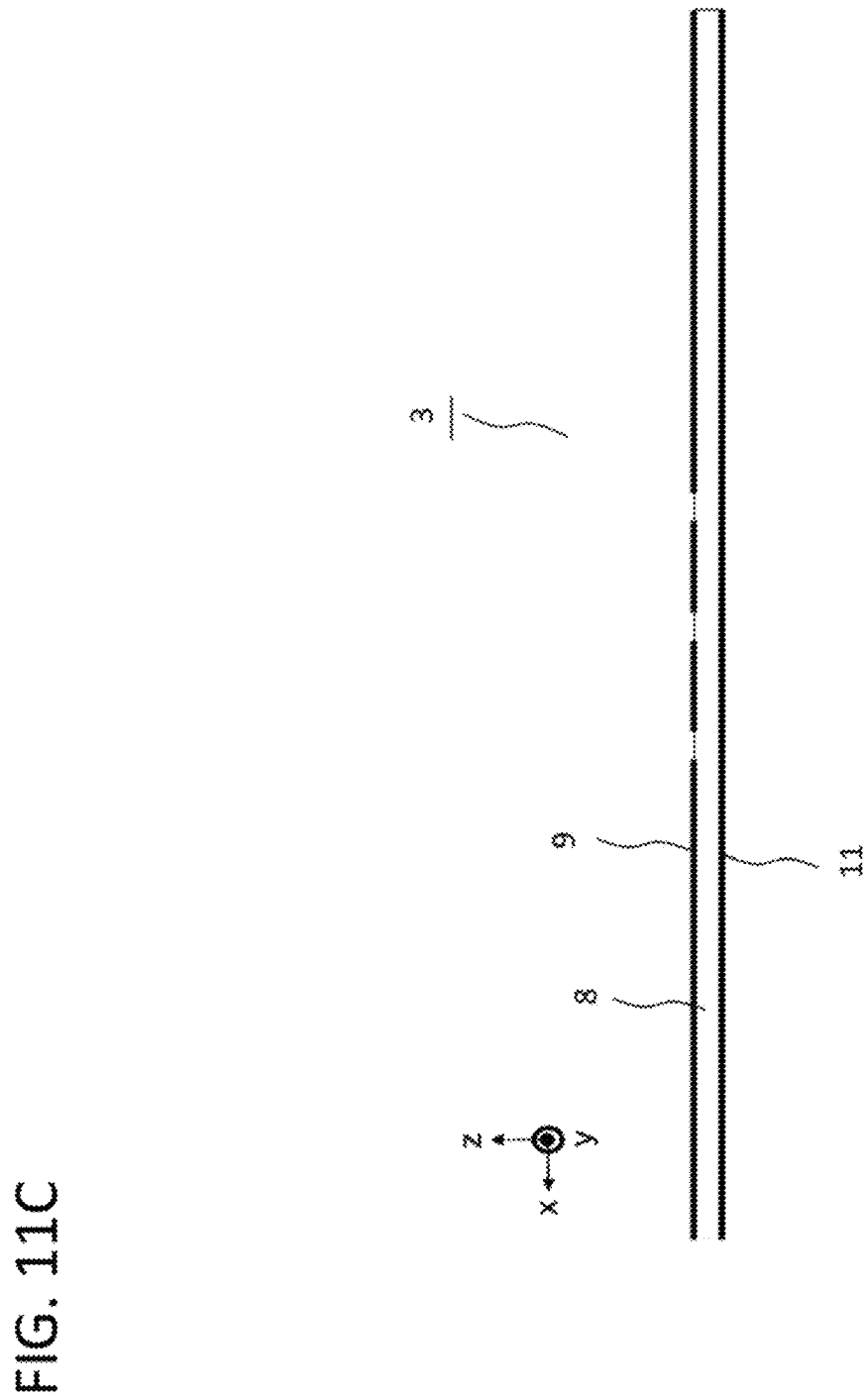
FIG. 11C is a diagram illustrating a side view of the PCB used for the sample holder according to the first example embodiment.
Figure 11D:
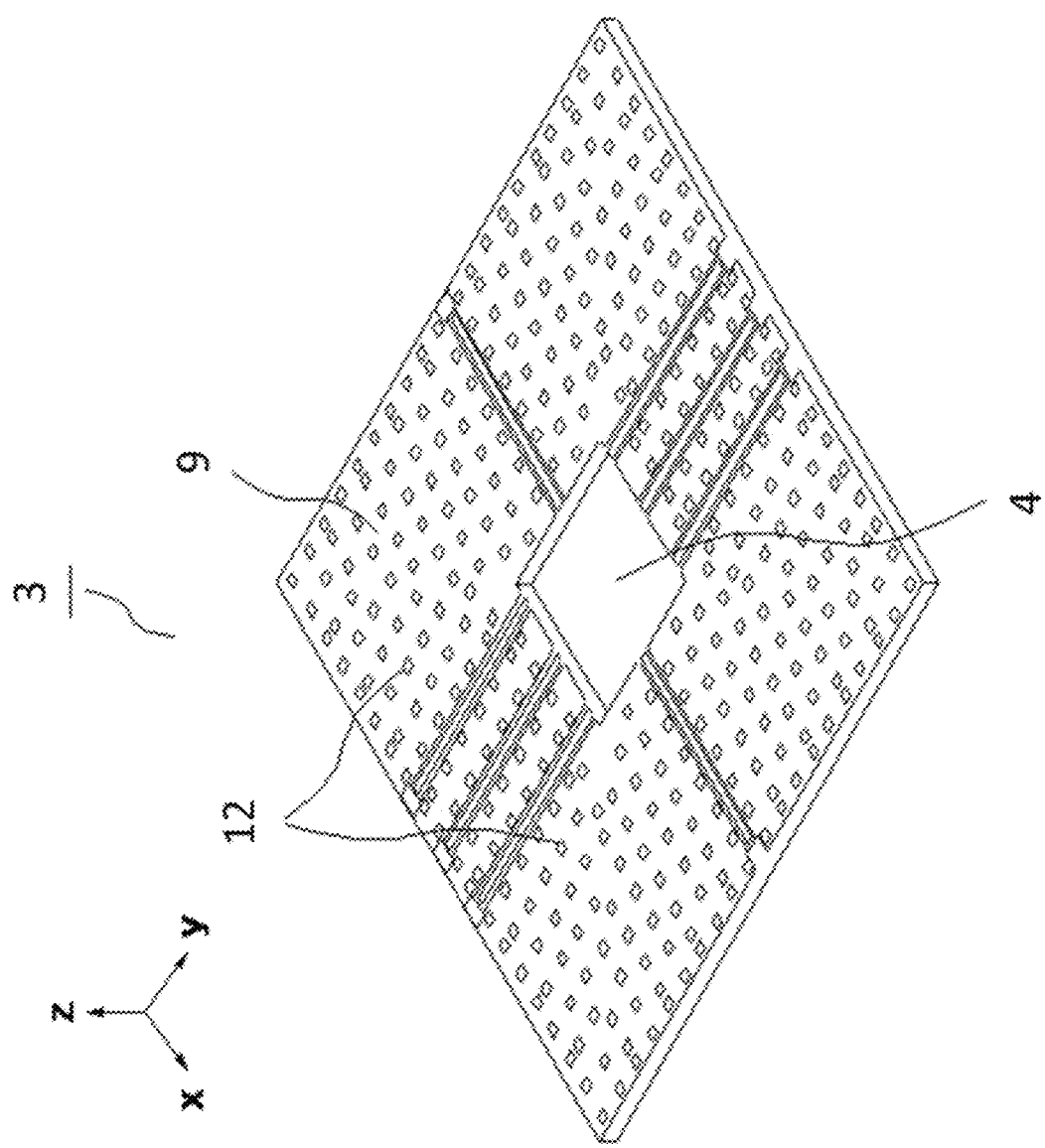
FIG. 11D is a diagram illustrating a perspective view of the PCB used for the sample holder according to the first example embodiment.
Figure 11E:
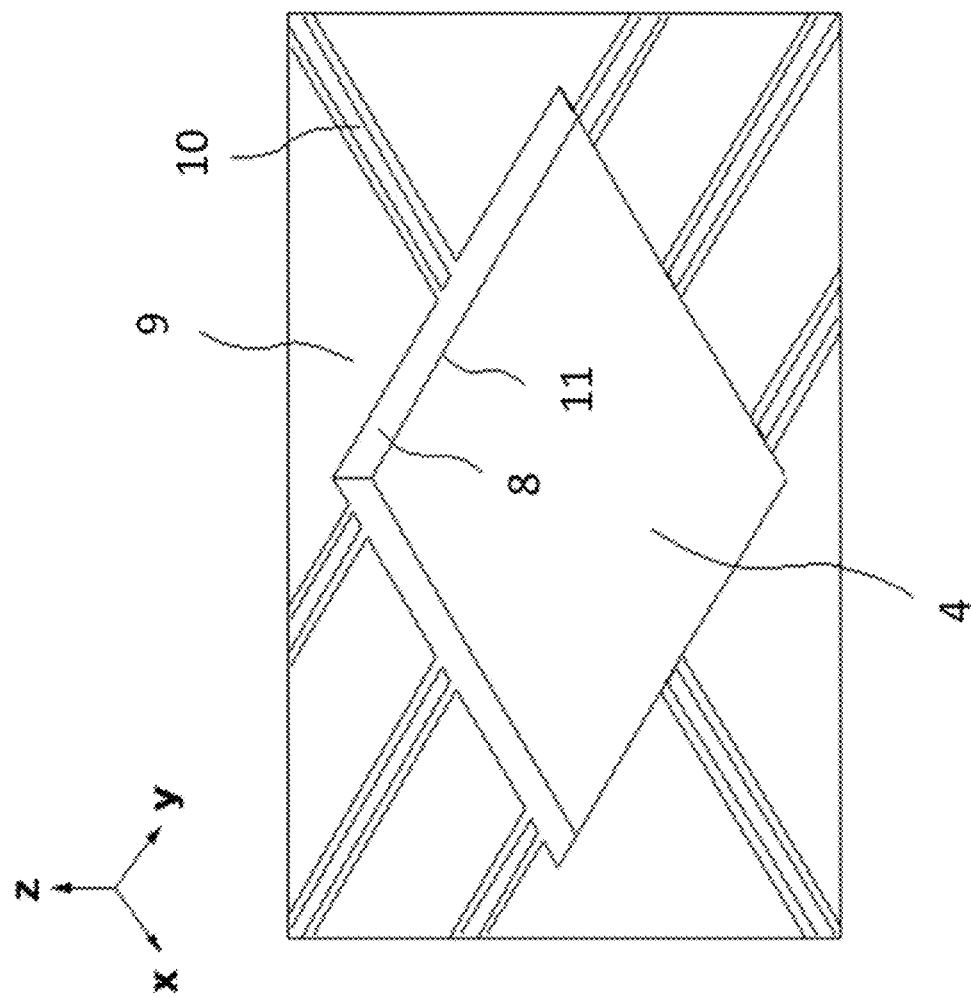
FIG. 11E is a diagram illustrating an enlarged view near a through opening of the PCB used for the sample holder according to the first example embodiment.

As illustrated in FIG. 11A to FIG. 11E, the PCB 3 include a dielectric 8 (substrate) with a plate-shape extending parallel to a x-y plane. The PCB 3 has a structure in which a front surface GND 9 and core wires 10 of coplanar waveguides are formed on one side (front surface) of the dielectric 8, and a rear surface GND 11 is formed on the other side (rear surface) of the dielectric 8. The core wires 10, the front surface GND 9 and the rear surface GND 11 are conductors, e.g., metal. Examples of the metal include such as Cu (copper) and Au-plated (gold-plated) Cu. In FIG. 11A, eight coplanar waveguides are formed in the PCB 3. The coplanar waveguides are the same as with FIG. 2A. There is no specific limitation to the number of coplanar waveguides formed in the PCB 3. As illustrated in FIG. 11D, the PCB 3 includes a plurality of through holes 12. These through holes 12 penetrate the dielectric 8 and electrically connect the front surface GND 9 to the rear surface GND 11. Each of the through holes 12, for example, is fabricated by forming a hole penetrating through the dielectric 8, the front surface GND 9 and the rear surface GND 11 and then plating an inside of the hole with metal.

In FIG. 9, the rear surface GND 11 (FIG. 11C) of the PCB 3 is abutting (in contact) with a placement surface of the PCB 3 of the pedestal 102. Therefore, the metal pedestal 2, the rear surface GND 11 of the PCB 3, the plurality of through holes 12 of the PCB 3, and the front surface GND 9 of the PCB 3 are electrically connected. In addition, the through opening 4 is formed near the center of the PCB 3. The through opening 4 has, for example, a same planar shape as that of a chip 7 of a superconducting quantum circuit mounted on the sample holder 1, i.e., a rectangular or square shape. In addition, an area of the through opening 4 of the PCB 3 is larger than that of the chip 7 to accommodate the chip 7 inside the through opening 4.

Figure 12:
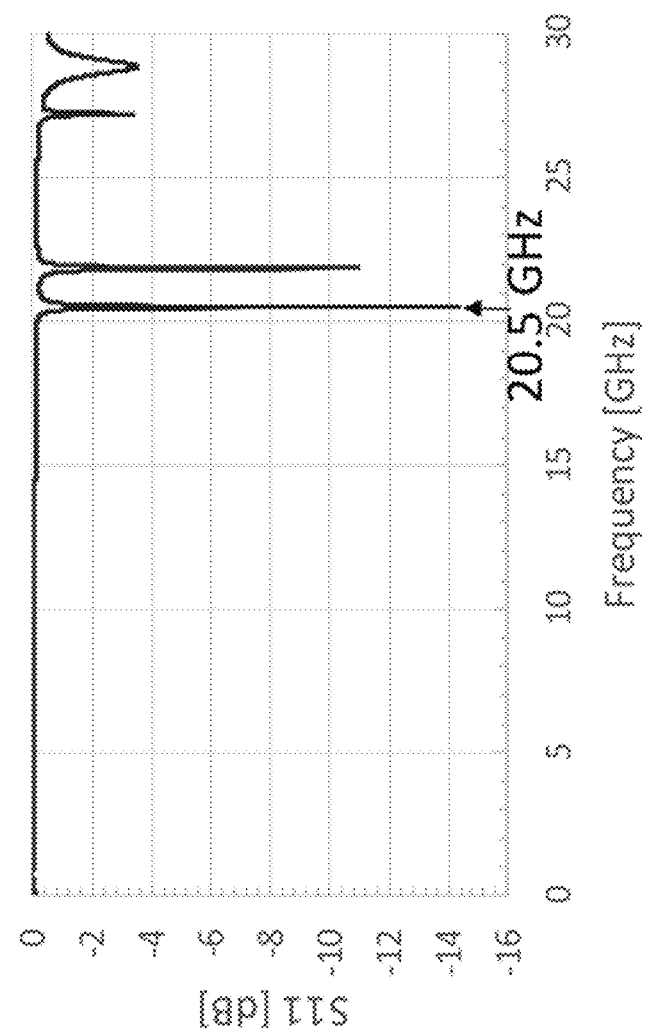
FIG. 12 is a diagram showing a simulation result of S11 when a chip is mounted with a bonding wire in the sample holder according to the first example embodiment.

FIG. 12 illustrates a simulation result of S parameter S11 of a system the chip 7 illustrated in FIG. 4A is mounted with the bonding wires 13 on the sample holder 1 illustrated in FIG. 9, according to the first example embodiment. S11 is a reflection coefficient at Port 1 when a high-frequency signal is supplied from Port 1 illustrated in FIG. 11. In the simulation of FIG. 12, an area of chip 7 is 5 mm×5 mm, with dimensions: a=5 mm, b=5 mm, d=3 mm, s=1 mm, and u=0.5 mm.

As illustrated in FIG. 12, a lowest chip-mode resonance frequency is 20.5 GHz. As illustrated in FIG. 12, according to the first example embodiment, the lowest chip-mode resonance frequency is enabled to be raised to a value higher than that of the simulation result illustrated in FIG. 8 (a simulation result of S parameter S11 in the system that the chip 7 illustrated in FIG. 4A is mounted with bonding wires 113 on the sample holder 101 illustrated in FIG. 7A to FIG. 7C).

The reason why the chip-mode resonance frequency could be raised by using the sample holder 1 of the first example embodiment is thought to be as follows.

As found by the simulation, in the present example embodiment, the bottom area of the cavity 5 is wider than that illustrated in FIG. 7A to FIG. 7C, so that a ratio of a component of the electric field generated when a chip-mode is excited inside the cavity 5 is increased. Therefore, in the present example embodiment, an effective dielectric constant is considered to be lower than that of the NPL 1, resulting in a higher chip-mode resonance frequency.

According to the simulation, the larger w (in the dimension of v×w of the chip 7), the greater effect of lowering the effective dielectric constant, whereas the larger w is, the lower a resonant frequency of the cavity itself. Therefore, a tradeoff between the two determines the w that can raise the chip-mode resonance frequency the most. In the case where the bottom area of the chip 7 is square with the dimension of v×v, u (protrusion length of the cavity 5) is preferably greater than 0 and 0.3v or less, according to the simulation.

According to the simulation, the larger a height d of the cavity 5, the higher the chip-mode resonance frequency becomes, but when the height d is increased to a certain extent, the chip-mode resonance frequency remains almost the same even if d is further increased.

Therefore, in the first embodiment, letting t denote a thickness of the chip 7 to be mounted on the sample holder 1, the height d of the cavity 5 illustrated in FIG. 10A to FIG. 10C is preferably at least 2t or more, more preferably at least 3t or more, and further more preferably at least 5t or more.

In the first example embodiment, the smaller a top area (area of a top) of each of the posts 6 illustrated in FIG. 10A to FIG. 10C the smaller a contacting area between a rear surface of the chip 7 and the top of each of the posts 6 of the pedestal 2, thus enabling to obtain a higher chip-mode resonance frequency. Therefore, when the chip 7 to be mounted on the sample holder 1 is rectangular with the length of a short side v, s is preferable to be 0.5v or less. Furthermore, s (length of equal sides of the post 6) is preferable to be 0.3v or less and is more preferable 0.2v or less. On the other hand, when the chip 7 to be mounted on the sample holder 1 is square with the length of one side v, s is preferable to be 0.5v or less. Furthermore, s is preferable to be 0.3v or less, and more preferable to be 0.2v or less.

Variation of the First Example Embodiment

Figure 13A:
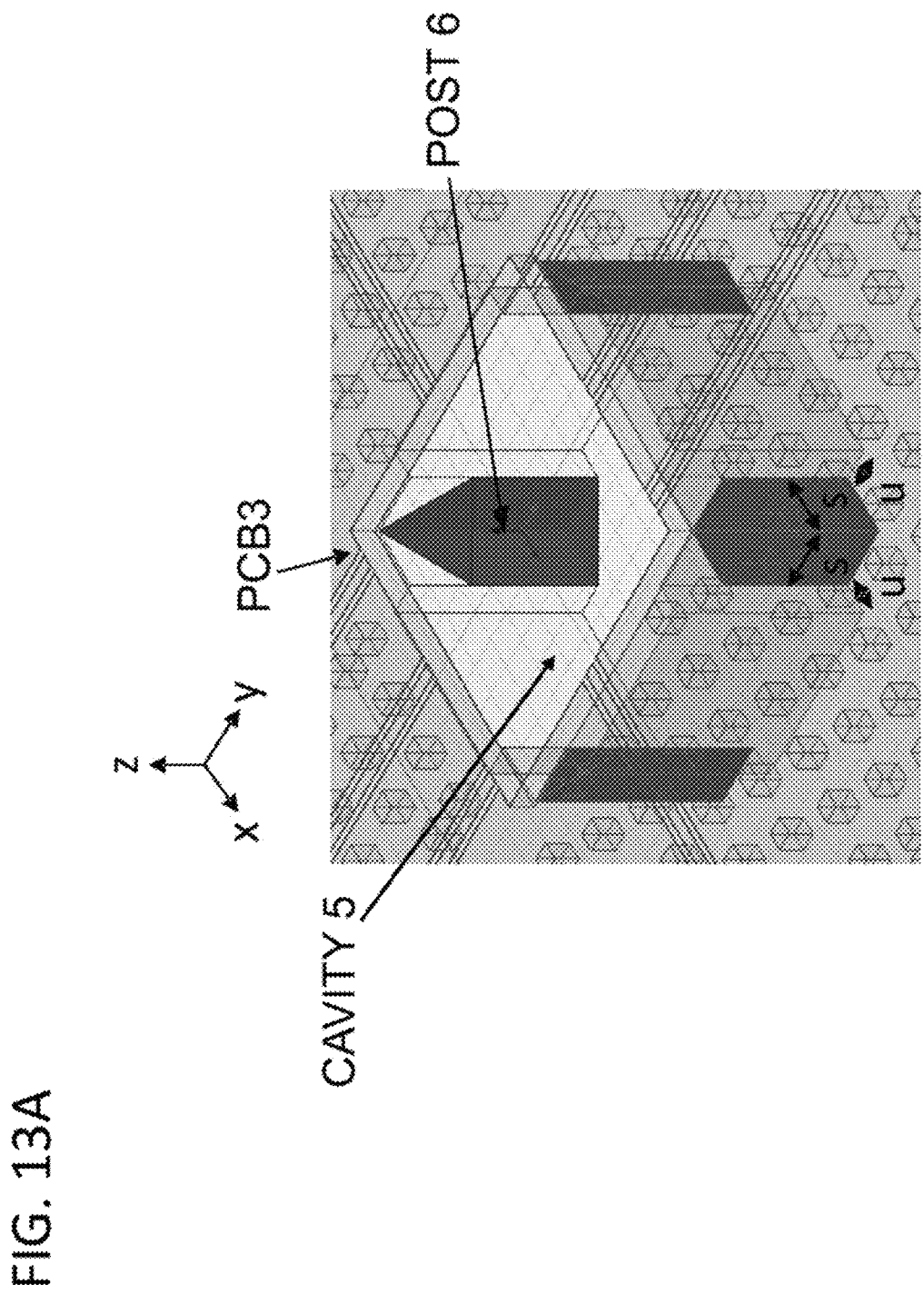
FIG. 13A is a diagram illustrating a perspective view of a sample holder according to a variation of the first example embodiment.
Figure 13B:
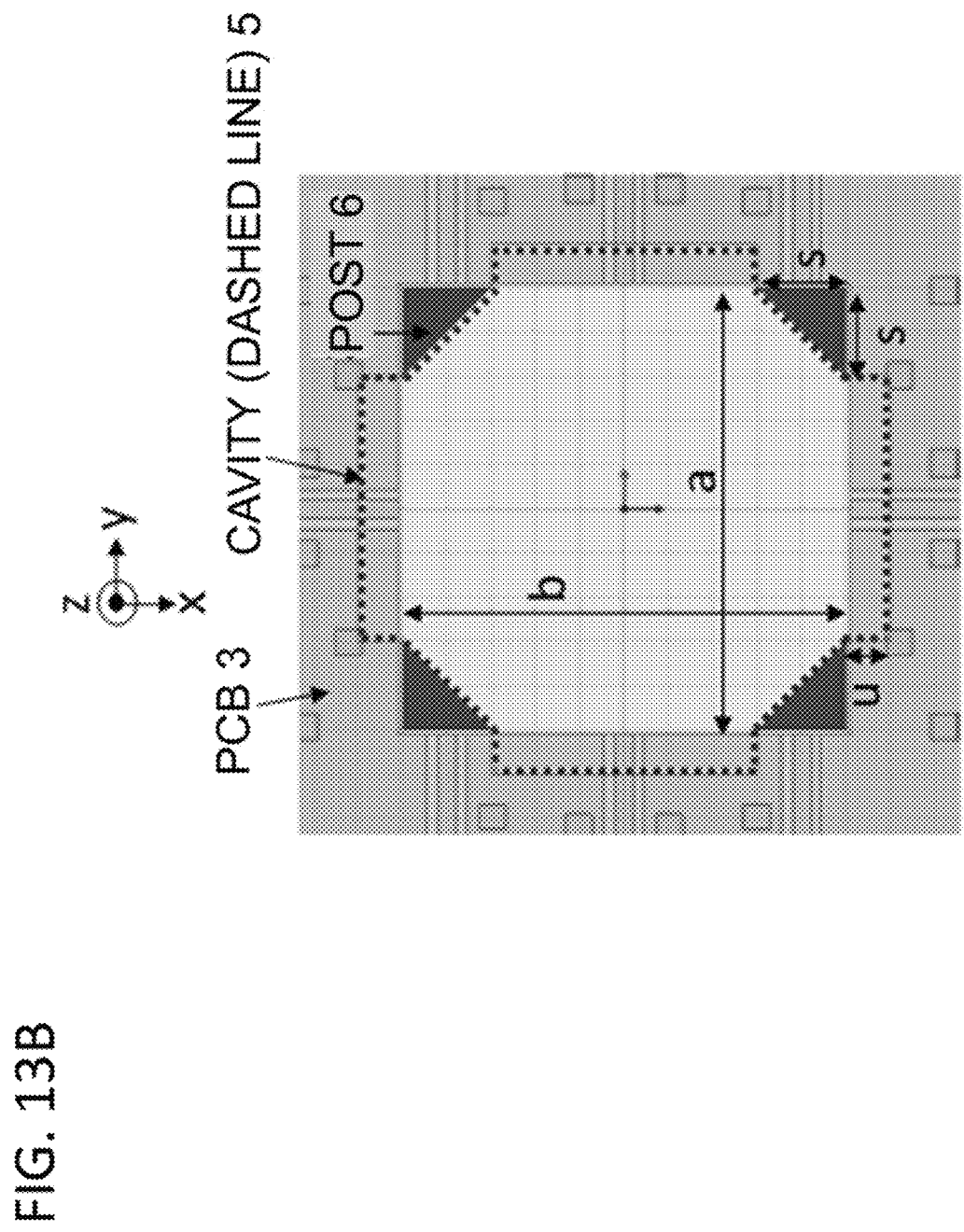
FIG. 13B is a diagram illustrating a top plan view of the sample holder according to the variation of the first example embodiment.
Figure 13C:
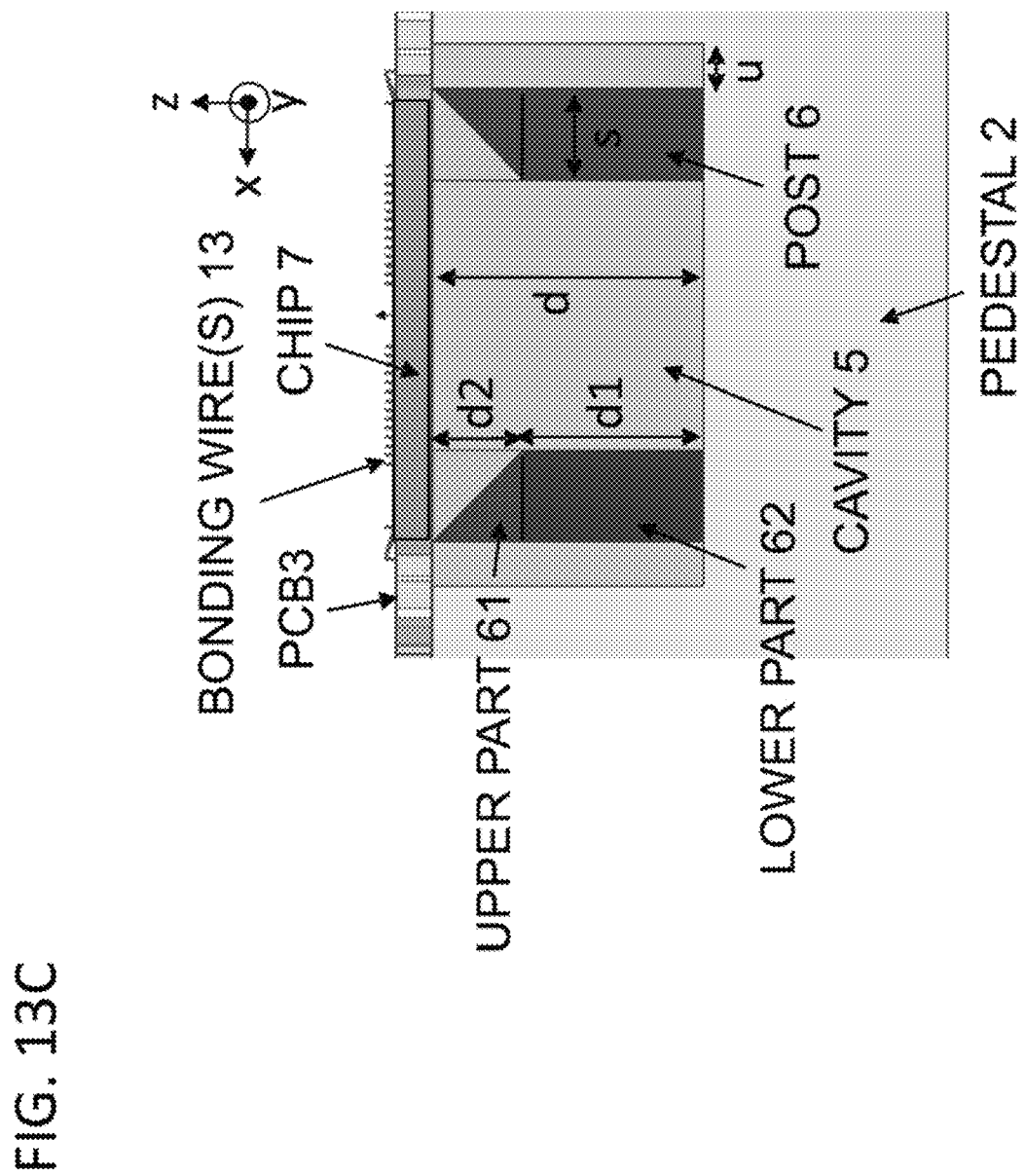
FIG. 13C is a diagram illustrating a see-through view from a positive direction of the y-axis of the sample holder according to the variation of the first example embodiment.

A sample holder 1 according to a variation of the first example embodiment has a configuration in which a PCB 3 is placed on the metal pedestal 2, as illustrated in FIG. 9. In the variation of the first example embodiment, the PCB 3 having the structure illustrated in FIG. 11A to FIG. 11E is used, as in the first example embodiment. In the variation of the first example embodiment, a cavity 5 having a structure such as illustrated in FIG. 13A to FIG. 13C is formed in a pedestal 2. FIG. 13A, and FIG. 13B, are a perspective view, and a top plan view. FIG. 13C is a see-through view (see-through side view) from the positive direction of the y-axis of a sample holder 1.

According to the variation of the first example embodiment, the cavity 5, similar to that of the first example embodiment (FIG. 10A and FIG. 10C) is formed at a location on the pedestal 2 directly under the through opening 4 of the PCB 3, that is, in a portion corresponding to directly under the chip 7 (FIG. 10C) when the chip 7 is mounted on the sample holder 1. According to the present variation, the cavity 5 formed in the pedestal 2 differs from a cavity of NPL 1 (the cavity 5 illustrated in FIG. 7A to FIG. 7C) in that a part of four side walls of the cavity 5 is extended outward by a length u. Therefore, the cavity 5 has substantially a cruciform planar shape viewed from the surface side of the PCB 3 (positive direction of the z-axis) as indicated by dashed lines in FIG. 13B. A bottom of the cavity 5 has a substantially cruciform planar shape, viewed from the surface side of the PCB 103 (positive direction of the z-axis), a part of the bottom surface of the cavity 5 (indicated by dashed lines in FIG. 13B) is protruded outward by a length u from an area where the chip 7 (FIG. 13C) is placed. In addition, there are provided support structures directly under the through opening 4, which support a surface of the chip 7 and is conductive to the pedestal 2. A material of the support structures is, for example, a metal. More specifically, the material of the support structures may include, for example, a mixture including metal, such as a resin mixed with metal grains or fillers.

The difference between the structure of the cavity 5 of the variation of the present variation and that of the first embodiment (FIG. 10A to FIG. 10C) resides in that, in the present variation, when the chip 7 is mounted on the sample holder 1, at least a part of the upper surfaces of the posts 6, which is surfaces facing the rear surface of the chip 7, is configured not to be parallel to the rear surface of the chip 7. That is, at least a part of the top surface of each of the posts 6 is not parallel to the top surface of the pedestal 2.

As illustrated in FIG. 13C, each of the posts 6 used for the sample holder 1 in the present variation includes an upper part 61 and a lower part 62 connected to each other. The lower part 62 has a shape of a triangle pole whose bottom surface has a shape of a right-angled isosceles triangle with the length of two equal sides (isosceles) s, and the height of the lower part 62 is d1. The upper part 61 has a shape of triangular cone. A bottom surface of the upper part 61 has a shape of a right-angled isosceles triangle. The height of the upper part 61 is d2, where d1+d2=d. The bottom surface of the upper part 61 and the top surface (bottom surface) of the lower part 62 are identical in shape and size. The upper part 61 may be a truncated triangular cone with the upper vertex of the triangular cone cut off.

In this structure, when the chip 7 is mounted on the sample holder 1, at least a part of the top part 61 (upper vertex) of each of the posts 6 is in contact (point contact) with each of the four corners of the rear surface of the chip 7. With this structure, a contact area between the rear surface of the chip 7 and the conductor posts 6 can be reduced as compared with the first example embodiment (the top surface of each of the posts 6 (triangle pole) has the same area as that of the bottom surface thereof).

Figure 14:
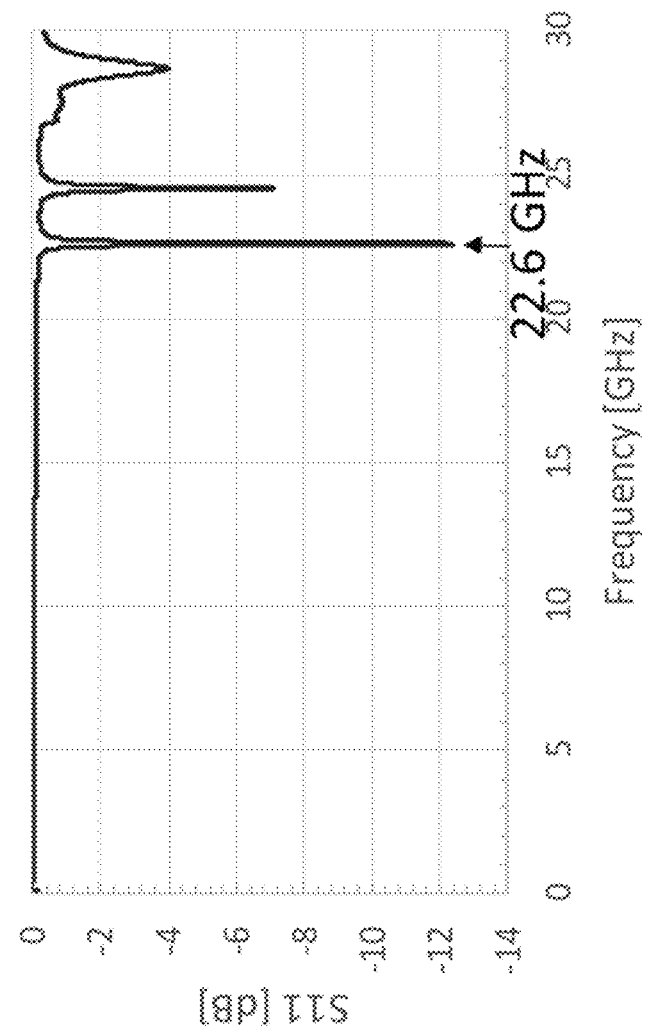
FIG. 14 is a diagram showing a simulation result of S11 when a chip is mounted with a bonding wire in the sample holder according to the variation of the first example embodiment.

A simulation result of S11, when the chip 7 is mounted with the bonding wires 13 on the sample holder 1 according to the present variation, is illustrated in FIG. 14. In the simulation, the area of chip 7 is 5 mm×5 mm, with the dimension of a=5 mm, b=5 mm, d=3 mm, d1=2 mm, d2=1 mm, s=1 mm, and u=0.5 mm. As illustrated in FIG. 14, the lowest chip-mode resonance frequency is enabled to be raised to 22.6 GHz that is higher than that of the simulation result of the first example embodiment.

Thus, the sample holder 1 of the variation of the first example embodiment has an effect that the chip-mode resonance frequency can be higher than that of the sample holder 1 of the first example embodiment.

The reason why the chip-mode resonance frequency according to the present variation could be raised higher than that according to the first example embodiment may be as follows. That is, in the first example embodiment, an electric field of the standing wave generated when chip-mode resonance occurs spreads mainly in a silicon substrate of the chip and in the cavity 5 (vacuum space) provided in the pedestal 2, but in portions directly above the posts 6 (top surfaces), in a space sandwiched between the GND plane 73 on the surface of the chip 7 and the top surfaces of the posts 6, there is only a silicon substrate, The electric field cannot spread into the vacuum space. Therefore, in the portions directly above the posts 6, the effective dielectric constant is high. On the other hand, according to the present variation, at least a part of the top surface of each of the posts 6 is not parallel to the rear surface of the chip 7 (the top of the posts 6 are not in surface contact with the four corners of the rear surface of the chip 7), therefore, in the portions directly above the upper parts 61 of the posts 6, in a space sandwiched between the GND plane 73 of the surface of the chip 7 and the upper parts 61 of the posts 6, there exist a silicon substrate and the cavity 5 (vacuum space). Therefore, in this portion (sandwiched between the top parts 61 of posts 6 and the rear surfaces of the four corners of chip 7), the electric field can spread in the vacuum space as well, as a result of which the effective dielectric constant in the portion directly above each of the posts 6 can be lower than that of the first example embodiment.

Second Example Embodiment

Figure 15A:
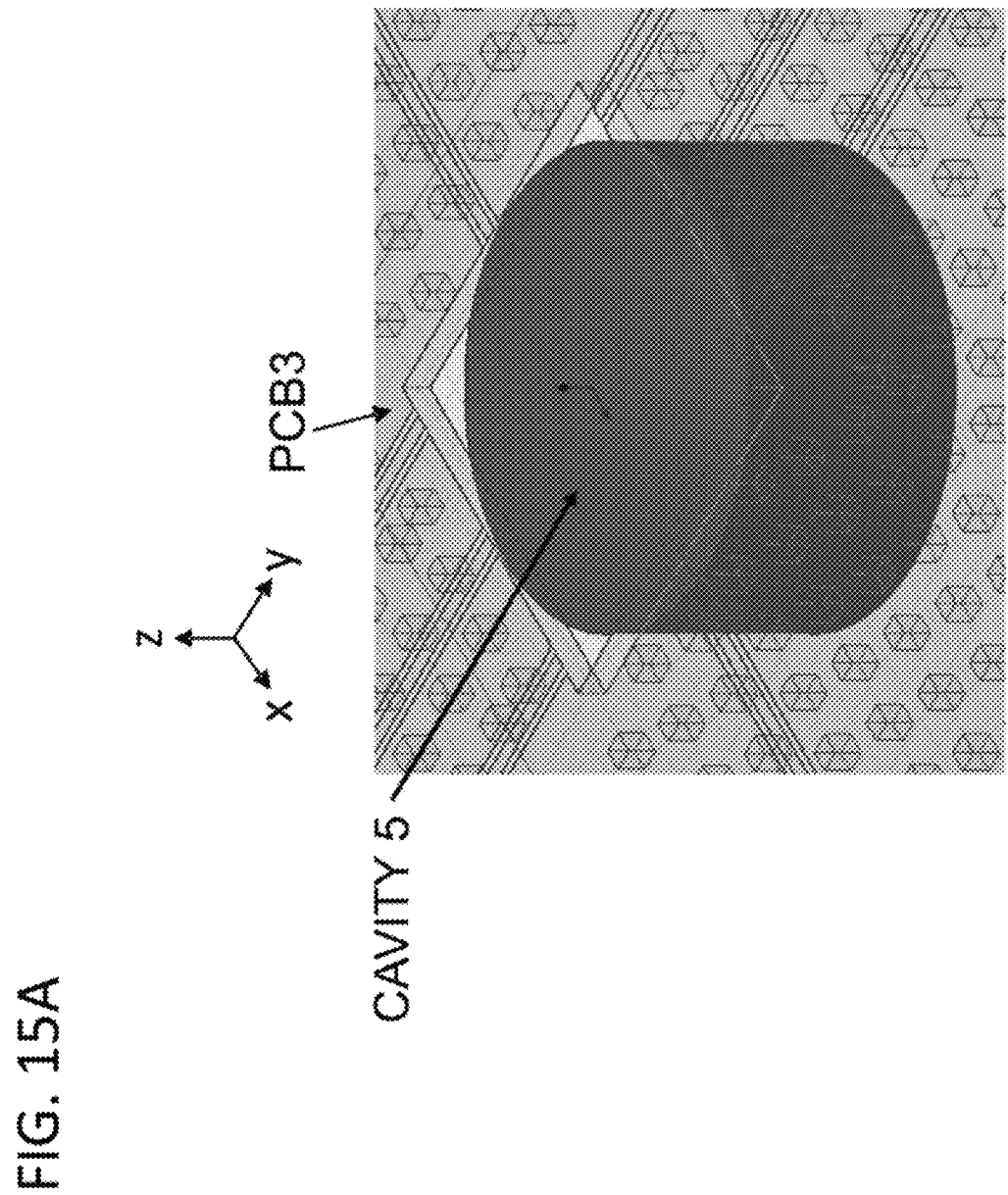
FIG. 15A is a diagram illustrating a perspective view of a sample holder according to a second example embodiment.
Figure 15B:
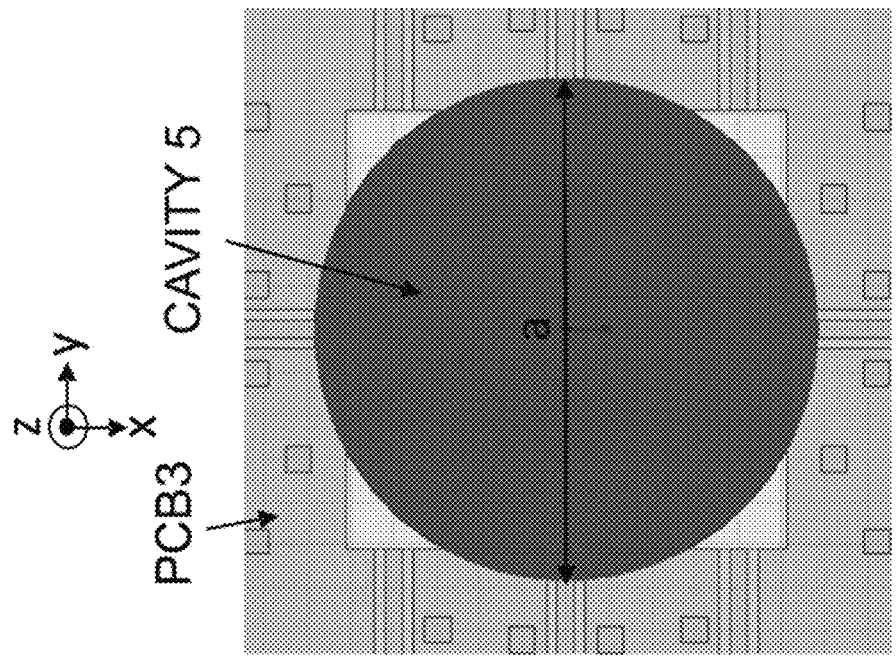
FIG. 15B is a diagram illustrating a top plan view of the sample holder according to the second example embodiment.
Figure 15C:
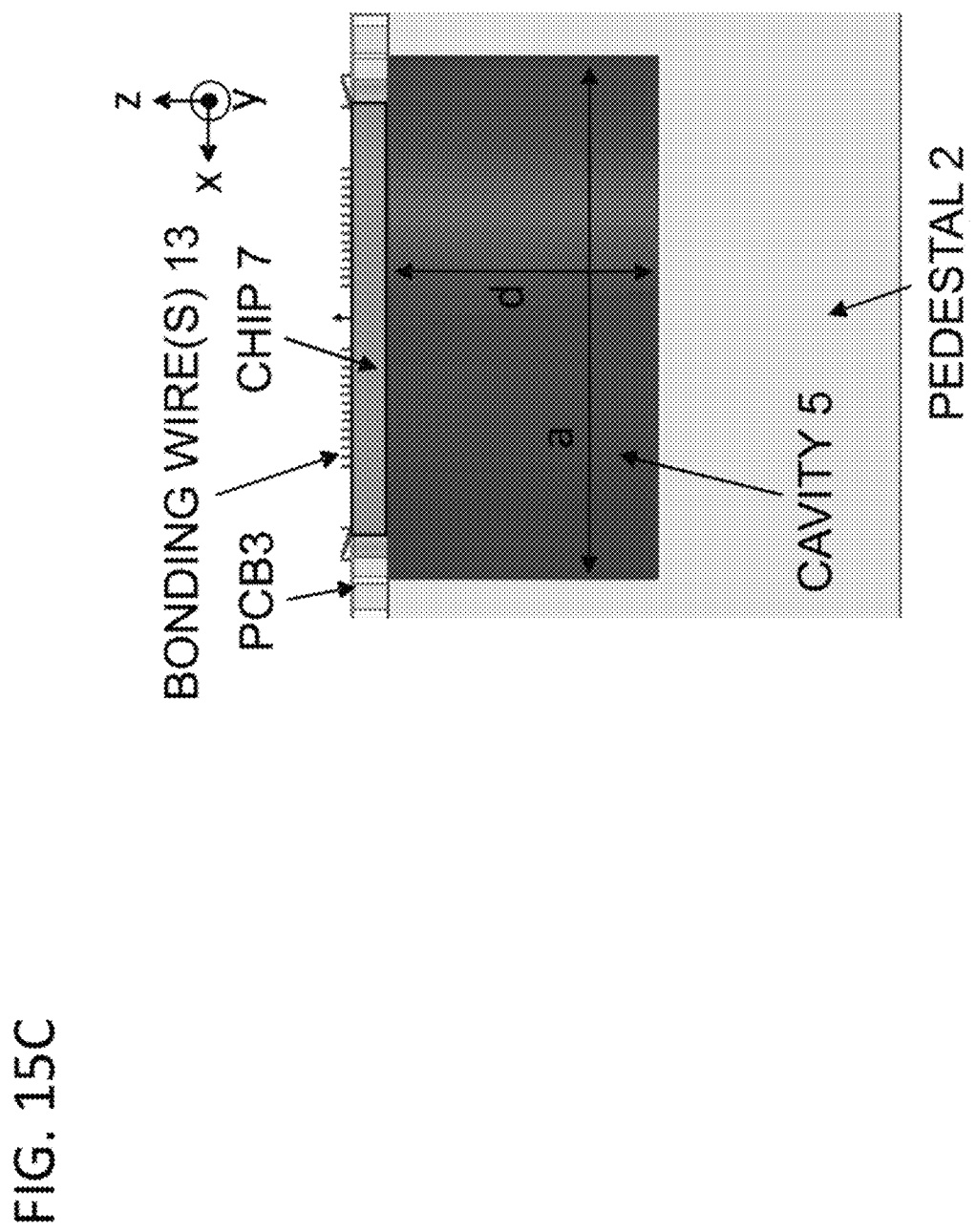
FIG. 15C is a diagram illustrating a see-through view from the positive direction of the y-axis of the sample holder according to the second example embodiment.

A sample holder 1 according to a second example embodiment has a configuration in which a PCB 3 is mounted on a metal pedestal 2 as illustrated in FIG. 9. In the second example embodiment, the PCB 3 with the structure illustrated in FIG. 11 is used, as in the first example embodiment. In the second example embodiment, at a portion of the pedestal 2 corresponding to directly under the through opening 4 of the PCB 3, i.e., at a portion directly under a chip when the chip is mounted on the sample holder 1, a cavity 5 is formed as illustrated in FIG. 15A to FIG. 15C. FIG. 15A and FIG. 15B are a perspective view and a top plan view according to the second example embodiment. FIG. 15C is a see-through view (see-through side view) from the positive direction of the y-axis of the sample holder 1. As illustrated in FIG. 15A to FIG. 15C, according to the second example embodiment, the cavity 5 formed in the pedestal 2 has a shape of a bottomed hollow cylinder. A diameter of the cylinder is longer than a length of one side of a bottom area (rectangle) of the chip 7 (FIG. 15C) and shorter than a length of a bottom surface (rectangle) diagonal of the chip 7. Therefore, as illustrated in FIG. 15B, the cavity 5 appears circular viewed from the surface side of PCB 3 (positive direction of z-axis). A part of circumference of the cavity 5 protrudes outward of each side of the chip 7 (each side of the through opening 4 of the PCB 3), while the other (remaining) part of the circumference of the cavity 5 is located inside of each side of the chip 7 (each side of the through opening 4 of the PCB 3). With this structure, when the chip is mounted on the sample holder 1, the chip 7 is supported by the pedestal 2. This prevents the chip from falling into the cavity 5. In FIG. 15A to FIG. 15C, the cavity 5 is illustrated in a different color (gradation) from the PCB 3 to clearly show the cavity 5.

Figure 16:
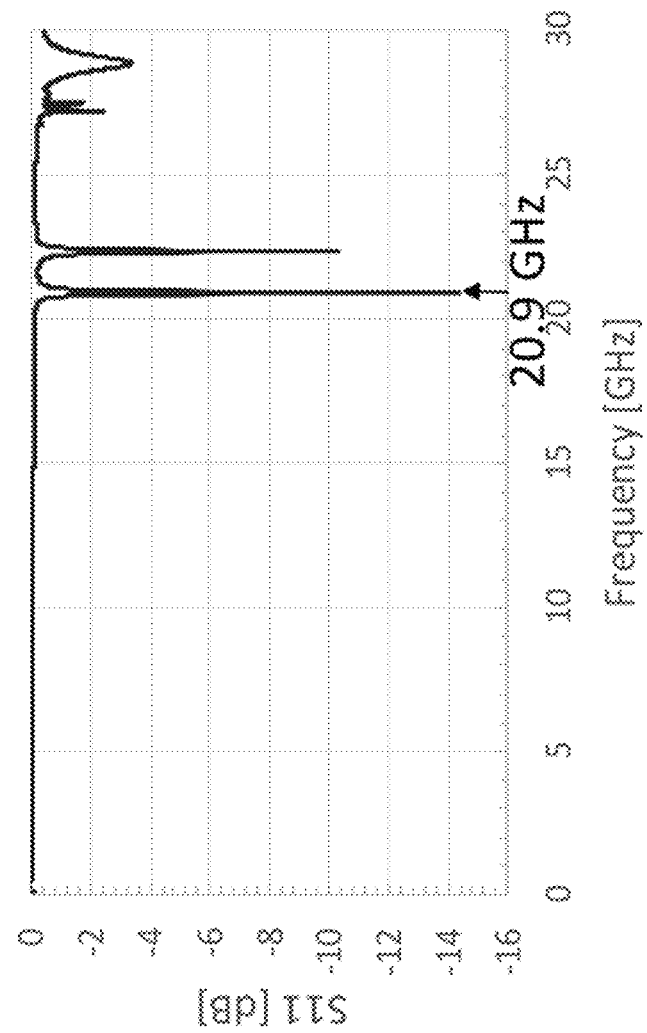
FIG. 16 is a diagram illustrating a simulation result of S11 when a chip is mounted with a bonding wire in the sample holder according to the second example embodiment.

FIG. 16 is a diagram illustrating a simulation result of S11 when the chip 7 is mounted with the bonding wires 13 on the sample holder 1 according to the second example embodiment. In the simulation, the area of chip 7 is 5 mm×5 mm, with the dimension of d=3 mm, and a=5.84 mm. As illustrated in FIG. 16, the lowest chip-mode resonance frequency is enabled to be raised to 20.9 GHz that is higher than that of shown in NPL 1.

The second example embodiment differs from the first example embodiment in the shape of the cavity 5. However, it shares the technical concept of the first example embodiment in that a part of the cavity 5 protrudes outward sides of the bottom surface (rectangle) of the chip 7 when viewed from the surface side of the PCB 3 (positive direction of the z-axis). The reason why the chip-mode resonance frequency could be made higher in the present embodiment than that shown in NPL 1 may be that the second example embodiment has practically the same mechanism as the first example embodiment. In the second example embodiment, the chip-mode resonance frequency can be further raised by deforming at least a part of a contact surface of a region of the pedestal 2 contacting with the rear surface of the chip 7 (four corners of the though hole 4 of the PCB 3 illustrated in white in FIG. 15A and FIG. 15B) at an angle so that it is not parallel to the rear surface of the chip 7, as with the variation of the first example embodiment.

Third Example Embodiment

Figure 17A:
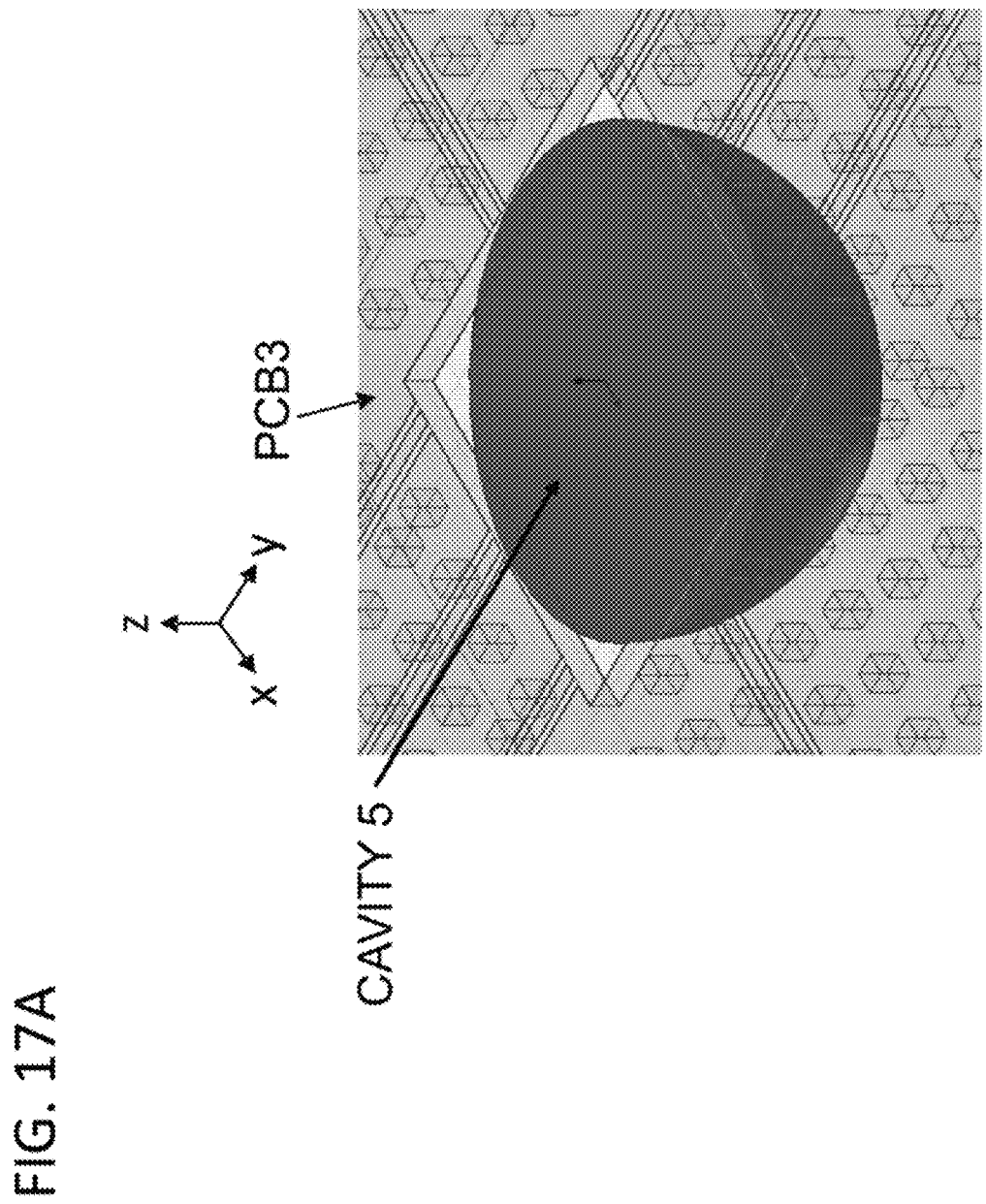
FIG. 17A is a diagram illustrating a perspective view of a sample holder according to a third example embodiment.
Figure 17B:
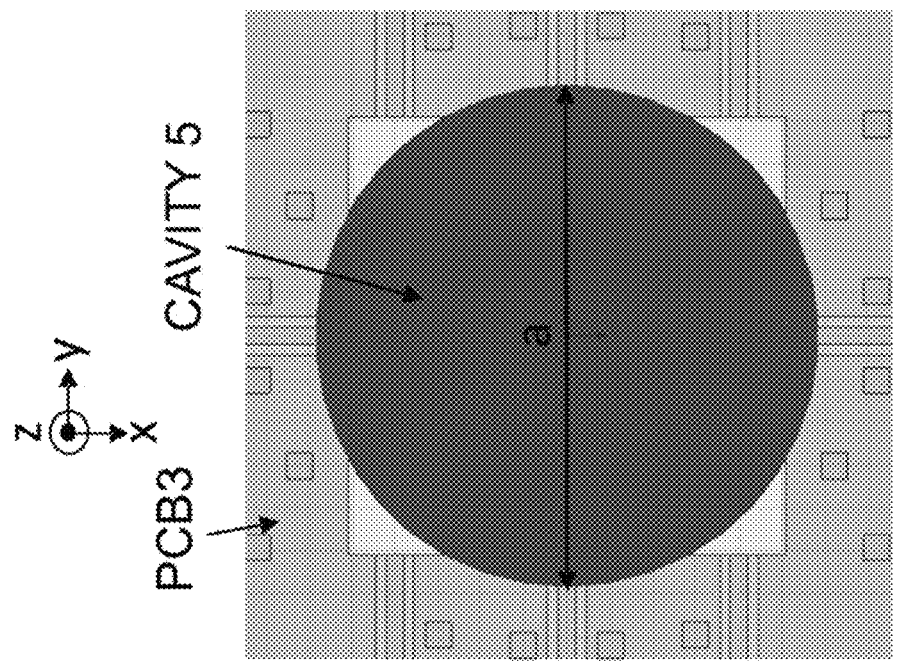
FIG. 17B is a diagram illustrating a top plan view of the sample holder according to the third example embodiment.
Figure 17C:
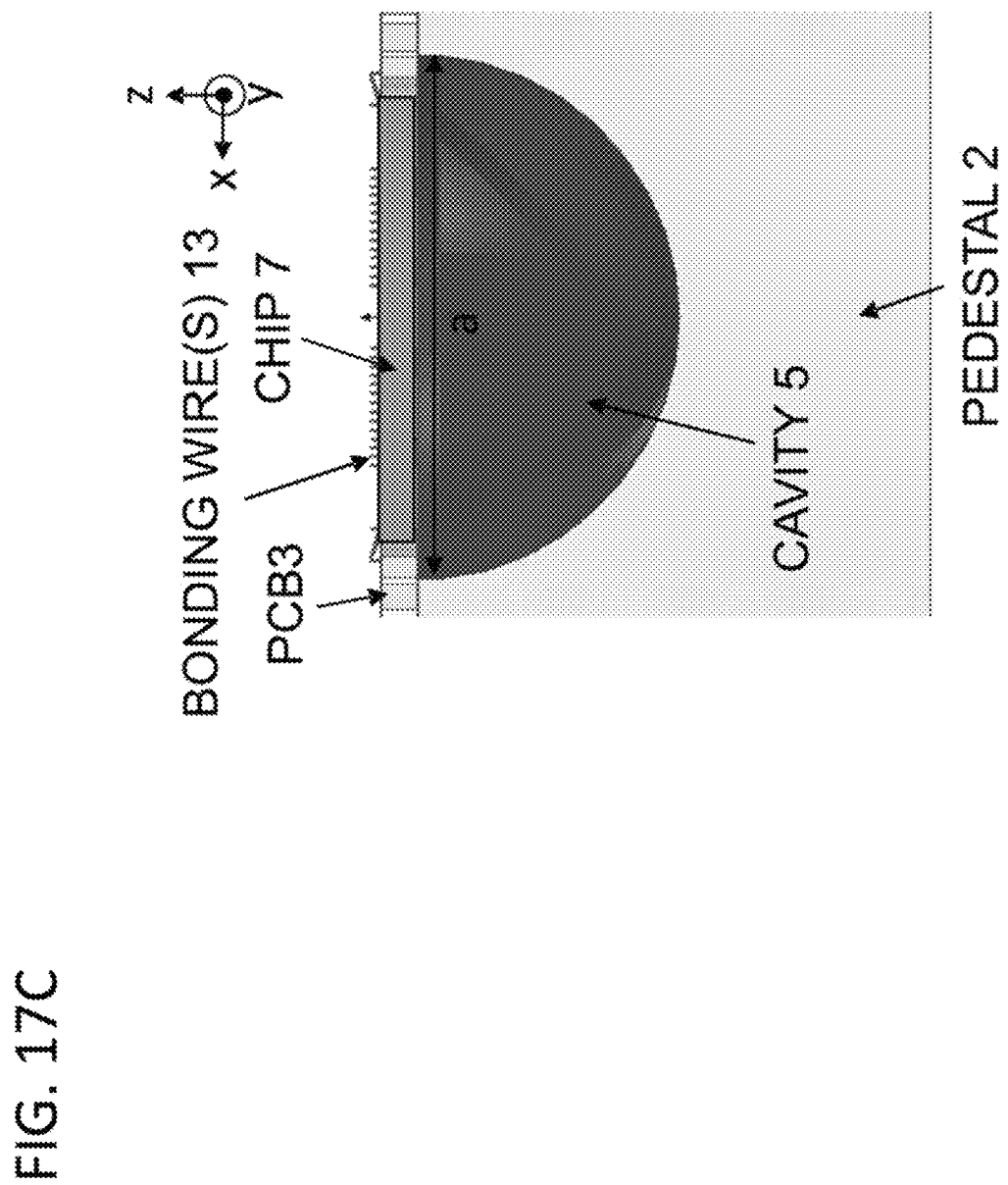
FIG. 17C is a diagram illustrating a see-through view from the positive direction of the y-axis of the sample holder according to the third example embodiment.

A sample holder 1 according to a third example embodiment has a configuration in which a PCB 3 is mounted on a metal pedestal 2 as illustrated in FIG. 9. In the third example embodiment, a PCB 3 with the structure illustrated in FIG. 11A to FIG. 11E is used, as in the first example embodiment. In the third example embodiment, at a portion of the pedestal 2 directly under a through opening 4 of the PCB 3, i.e., at a portion directly under a chip when the chip is mounted on the sample holder 1, a cavity 5 illustrated in FIG. 17A to FIG. 17C is formed. FIG. 17A and FIG. 17B are perspective and top plan views of the sample holder 1 according to the third example embodiment. FIG. 17C is a see-through view (see-through side view) from the positive direction of the y-axis of the sample holder 1. As illustrated in FIG. 17A, according to the present example embodiment, the cavity 5 formed in the pedestal 2 is in a shape of a hemisphere (hollow hemisphere). A diameter a of the hemisphere is longer than a length of one side of a bottom surface (rectangle) of the tip 7 (FIG. 17C). Therefore, as illustrated in FIG. 17B, a top surface of the cavity 5 appears circular viewed from a surface side of PCB 3 (positive direction of z-axis). At least a part of its circumference protrudes outward of a side of the chip 7 (corresponding side of the through opening 4 of the PCB 3). In the third example embodiment, since the cavity 5 is hemispherical in shape, the cavity 5 becomes narrower from a top toward a bottom. Therefore, even if the diameter a of the cavity 5 is equal to a diagonal of a bottom surface of the chip 7, when mounting the chip 7 on the sample holder 1, the chip 7 can be prevented from falling into the cavity 4. Thus, an upper limit of the diameter a of the cavity 5 can be the same length as the diagonal of the bottom surface of the chip 7. FIG. 17A to FIG. 17C, the cavity 5 is illustrated in a different color (gradation) from the PCB 3 to make the cavity 5 clear.

Figure 18:
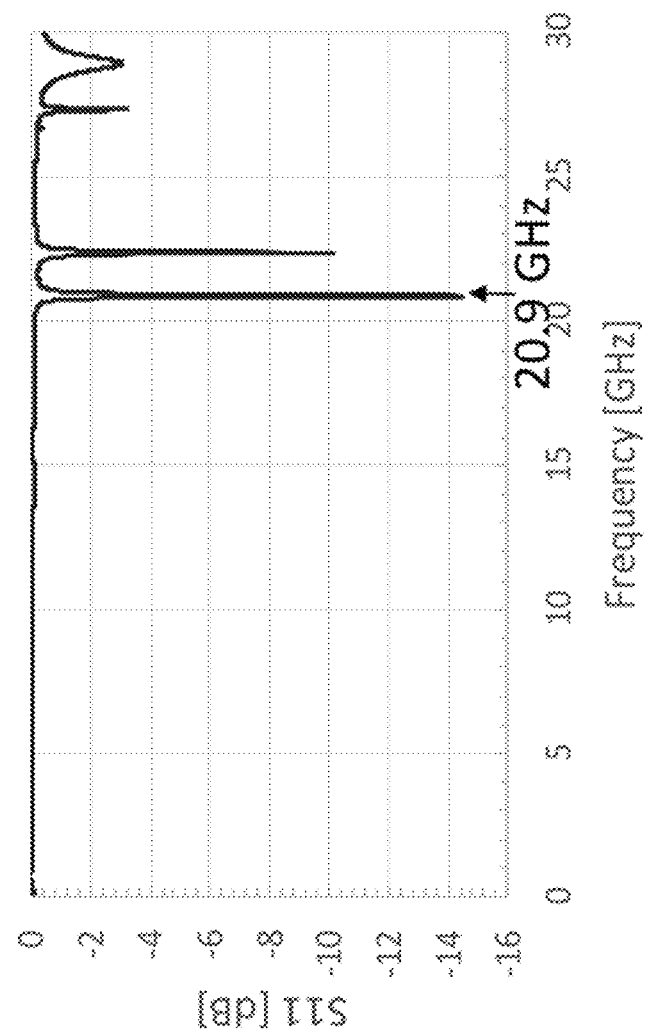
FIG. 18 is a diagram showing a simulation result of S11 when a chip is mounted with a bonding wire in the sample holder according to the third example embodiment.

FIG. 18 is a diagram illustrating a simulation result of S11 in the case where the chip 107 illustrated in FIG. 4 is mounted with the bonding wires 13 on the sample holder 1 of the third example embodiment. In the simulation, the area of chip is 5 mm×5 mm, and a=5.84 mm. As illustrated in FIG. 18, the lowest chip-mode resonance frequency is enabled to be raised to 20.9 GHz higher than that of FIG. 6A (the case of NPL 1).

The third example embodiment differs from the first and the second example embodiments in the shape of the cavity 5. However, it shares the technical concept of the first and the second example embodiments in that a part of the cavity 5 protrudes outside side edges of the bottom surface (rectangle) of the chip 7 when viewed from the surface side of the PCB 3 (positive direction of the z-axis). The reason why the chip-mode resonance frequency is enabled to be higher in the third example embodiment than of NPL 1 may be ascribable to the same mechanism as the first and the second example embodiments.

Another Example of Third Example Embodiment

Figure 19A:
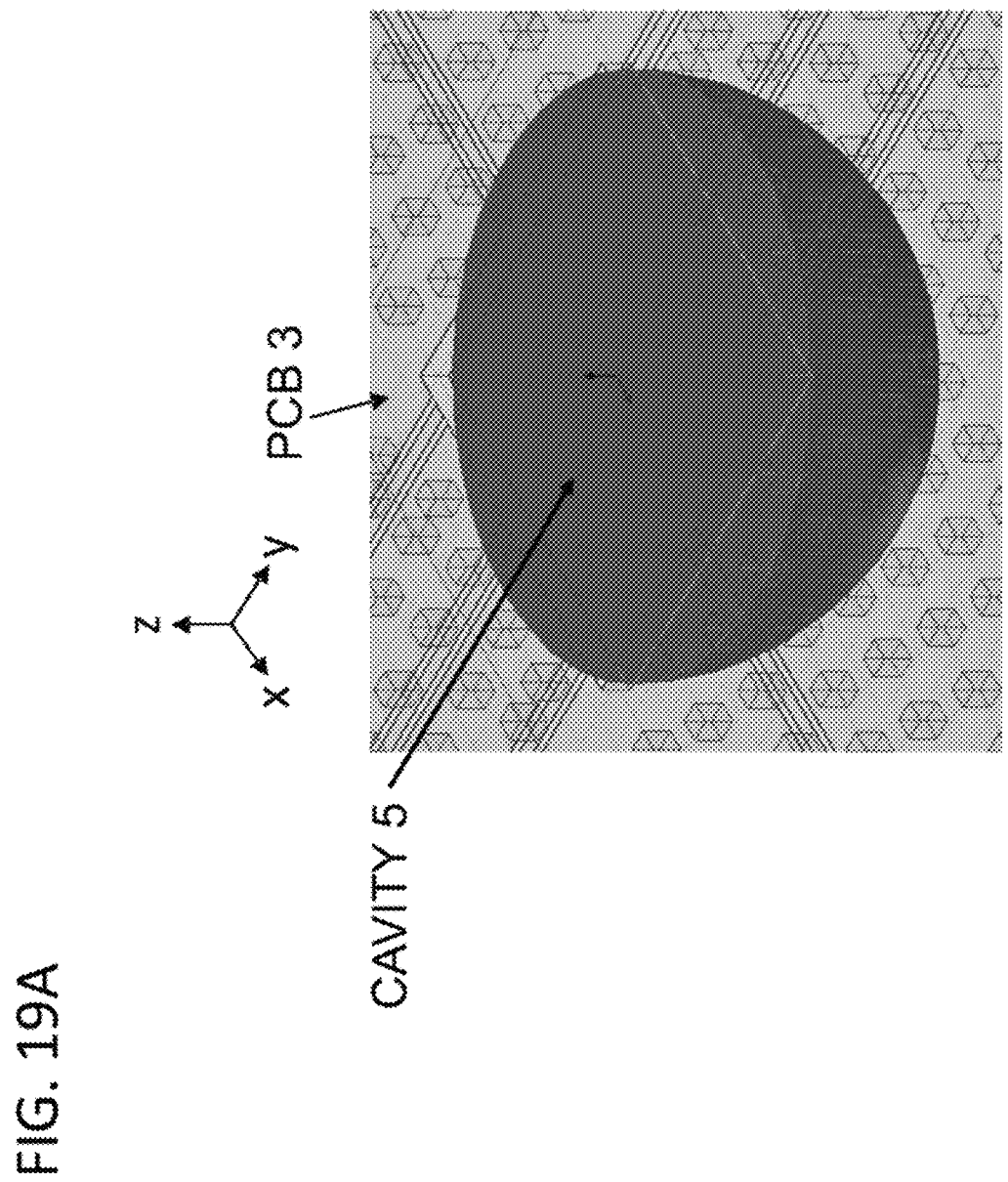
FIG. 19A is a diagram illustrating a perspective view of a sample holder according to an other example of the third example embodiment.
Figure 19B:
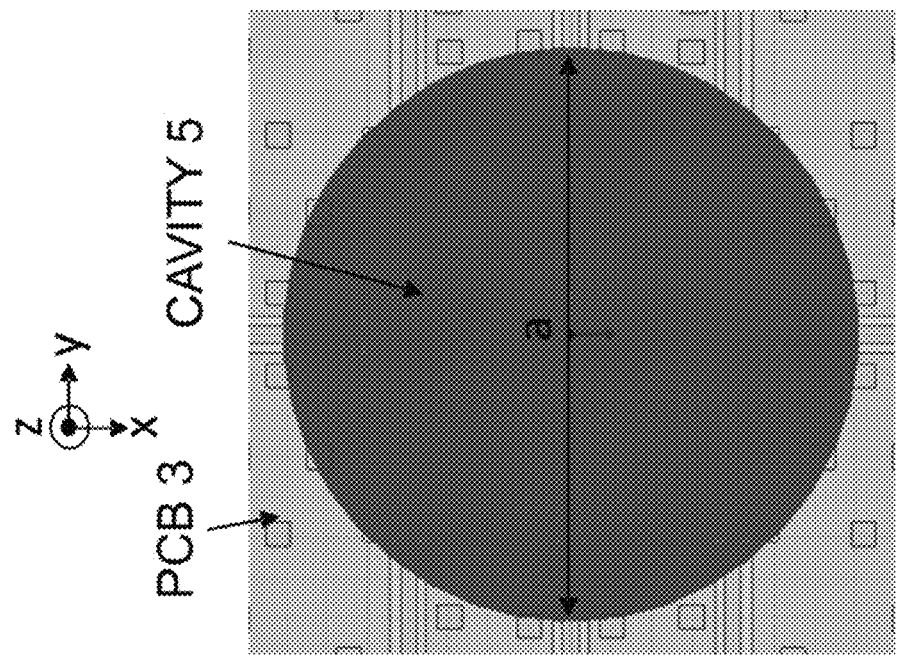
FIG. 19B is a diagram illustrating a top plan view of the sample holder according to the other example of the third example embodiment.
Figure 19C:
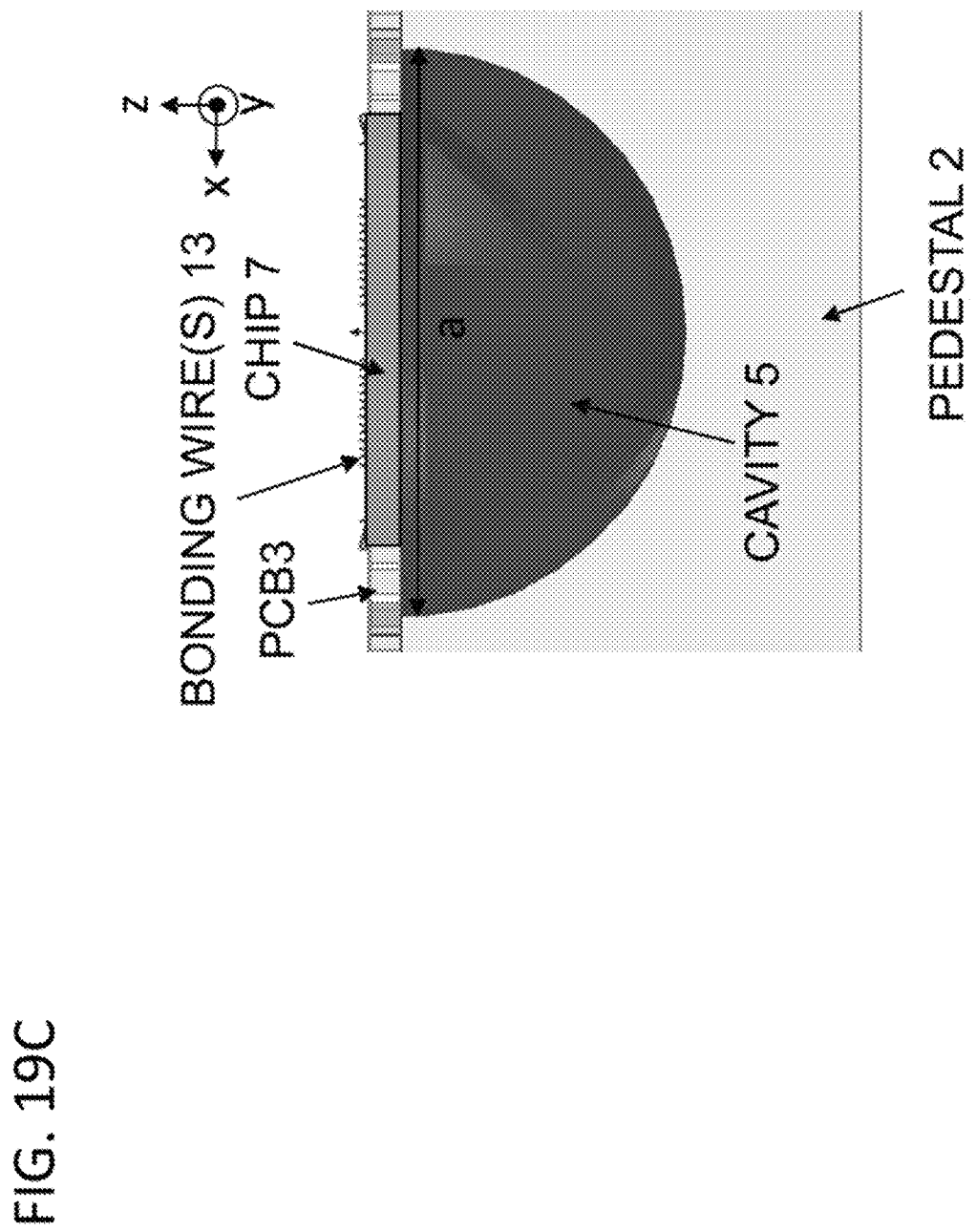
FIG. 19C is a diagram illustrating a see-through view from the positive direction of the y-axis of the sample holder according to the other example of the third example embodiment.
Figure 20:
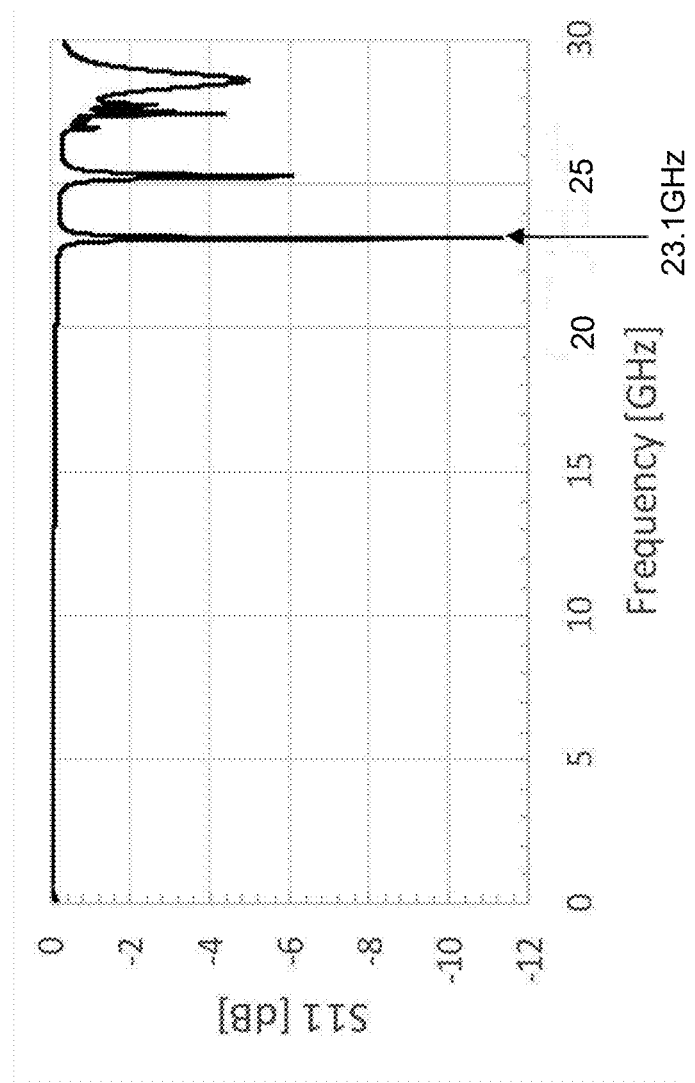
FIG. 20 is a diagram showing a simulation result of S11 when a chip is mounted with a bonding wire in the sample holder according to the other example of the third example embodiment.

FIG. 19A, FIG. 19B, and FIG. 19C illustrate a sample holder 1 according to another example of the third example embodiment. In the present example, a diameter a of a cavity 5 to be formed in a pedestal 2 is approximately the same as a length of a diagonal (a length of a diagonal of a through opening 4 on a PCB 3) of a bottom surface (rectangular) of the chip 7 (FIG. 19C). Since the cavity 5 is hemispherical in shape, which means that the cavity 5 becomes toward the bottom, the chip 7 can be prevented from falling into the cavity 5 when the chip 7 is mounted with bonding wires 13 on the PCB 3 of the sample holder 1. FIG. 20 is a diagram illustrating a simulation result of S-parameter S11 when the chip 7 is mounted with the bonding wires 13 on the sample holder 1 according to the present example. In the simulation, the area of chip is 5 mm×5 mm, and a=7.08 mm. As illustrated in FIG. 20, the lowest chip-mode resonance frequency according the another example of the third example embodiment is enabled to be raised higher to 23.1 GHz. The resonant frequency is made to be higher than that of FIG. 18. The reason is that in FIG. 18, in each of the four corner regions of the chip 7, a space sandwiched between the GND plane of the chip 7 and the pedestal 2 is occupied by a silicon (substrate), which has a high dielectric constant, whereas in the another example, at the four corner regions of the chip 7, the space between the GND plane and the pedestal 2 of the chip 7 includes a silicon (substrate) and a vacuum space, resulting in a lower effective dielectric constant.

Other Example Embodiment

According to the first through the third example embodiments and variations thereof as the method for mounting the chip 7 with a superconducting quantum circuit, the configuration is described in which the chip 7 is directly placed on the metal pedestal 2, but the mounting method, as a matter of course, is not limited to the above. For example, even in a case of a mounting method in which a resin material such as varnish is applied on the metal pedestal 2 and then a chip 7 is placed on a resin material such as varnish, the effect of each embodiment, i.e., enhancing the chip-mode resonance frequency can be achieved.

In the first through the third example embodiments and variations thereof, the configuration of the sample holder 1 is described in which the PCB 3 is placed directly on the metal pedestal 2. However, a sample holder 1 having a configuration in which a sheet of metal such as In (indium) is placed on a metal pedestal 2, and the PCB 3 is placed on the sheet of metal such as In can also achieves the effect of each example embodiment described above. By placing a soft sheet of a metal such as In between the pedestal 2 and the PCB 3, a gap between a rear surface GND 11 of the PCB 3 and the pedestal 2 can be less likely to occur. This may improve high-frequency characteristics of the sample holder 1. More specifically, when there is a gap between the rear surface of the PCB 3 and pedestal 2, the gap would form a new cavity resonator. This may induce a resonance when a signal of a specific frequency is supplied to the chip 7. For this reason, there is preferably no gap between the rear surface GND 11 of the PCB 3 and the pedestal 2.

In the first through the third example embodiments and variations thereof, the configuration of the sample holder 1 is described in which the PCB 3 is placed directly on the metal pedestal 2. However, a lid of metal (metal lid) may be placed on the PCB 3. Even when the lid is placed, the effect of the above-described example embodiment can be obtained. In such a sample holder 1, the metal lid is electrically in contact with a front surface GND 9 of the PCB 3 (see FIG. 11A). However, the lid should not be in contact with a core wires 10 of the PCB 3 (see FIG. 11A) or a chip 7. This is to ensure that circuits and/or wiring of the chip 7 and the core wires 10 of the PCB 3 do not come into contact with the GND. For the same reason as above, there is preferably no gap between the front surface GND 9 of the PCB 3 and the lid. Therefore, a sheet such as made of in may be interposed between the lid and the front surface GND 9 of the PCB 3.

In the first through the third example embodiments and variations thereof, cases where the pedestal 2 is rectangular or cubic are exemplified as a shape of the sample holder 1. However, the shape of the pedestal 2 can be another shape, such as a cylinder, to achieve the effect of each example embodiment described above. Similarly, even if the shape of the PCB 3 can also be circular or other shapes other than rectangular or square, and the effect of each example embodiment can be achieved.

The above disclosures of the first through the third example embodiments and variants thereof are applicable to mounting techniques for a superconducting quantum circuit.

The disclosure of each of the above PTL 1 and NPL 1 is incorporated herein by reference thereto. Modifications and adjustments of the example embodiments and examples are possible within the scope of the overall disclosure (including the claims) of the present disclosure and based on the basic technical concept of the present disclosure. Various combinations or selections of various disclosed elements (including the elements in each of the notes, example embodiments, drawings, etc.) are possible within the scope of the claims of the present invention. That is, the present invention of course includes various variations and modifications that could be made by those skilled in the art according to the overall disclosure including the claims and the technical concept.

What is claimed is:

1. A sample holder comprising:
a pedestal made of metal; and
a Printed Circuit Board (PCB) placed on the pedestal, the PCB including a through opening that penetrates from a front surface to a rear surface of the PCB,
wherein the pedestal includes a cavity bottomed and with a top of the pedestal opened, the cavity formed at a portion corresponding to directly under the through opening on a side of the pedestal on which the PCB is placed,
as a configuration on the side on which the PCB is placed, viewed from above, a part of the cavity protruded outward from the through opening, and
wherein the through opening of the PCB is a bottomless opening in a rectangular planer shape corresponding to a rectangular planar shape of a chip to be mounted in the through opening,
the cavity formed in the pedestal is bottomed and top opened with a rectangular planer shape corresponding to a planar shape of the through opening,
the pedestal includes, at each of four corners of the rectangular-shaped cavity bottomed and top opened, a support member to support the chip when the chip is mounted thereto, and
as the configuration of the pedestal on the side on which the PCB is placed, viewed from above,
the cavity has at least a part of a region other than a region with the support member arranged, protruded outwardly by a predetermined width against at least a part of a side connecting two adjacent corners of the through opening.

2. The sample holder according to claim 1, wherein the cavity is cruciform in a shape on at least a top surface thereof.

3. The sample holder according to claim 1, wherein the cavity is in a shape of a bottomed hollow cylinder with a top thereof opened.

4. The sample holder according to claim 3, wherein the through opening of the PCB is a bottomless opening in a rectangular planer shape corresponding to a rectangular planar shape of a chip to be mounted in the through opening, and
as the configuration of the pedestal on the side on which the PCB is placed, viewed from above,
a circular opening of at least a top surface of the cavity with a shape of the hollow cylinder includes a region protruded radially outward by a predetermined length against at least a part of a side connecting two adjacent corners of the through opening.

5. The sample holder according to claim 1, wherein the cavity is in a shape of a hollow hemisphere with a top thereof opened.

6. The sample holder according to claim 5, wherein the through opening of the PCB is a bottomless opening in a rectangular planer shape corresponding to a rectangular planar shape of a chip to be mounted in the through opening, and
as the configuration of the pedestal on the side on which the PCB is placed, viewed from above,
a circular opening of a top surface of the cavity with a shape of the hollow hemisphere includes a region protruded radially outward by a predetermined length against at least a part of a side connecting two adjacent corners of the through opening.

7. The sample holder according to claim 1, wherein the pedestal includes a contact surface that contacts a chip accommodated in the through opening of the PCB, at least a part of the contact surface configured to be not parallel to a rear surface of the chip.

8. The sample holder according to claim 1, wherein the support member includes a post arranged at each corner of the rectangular shaped cavity bottomed with a top opened, the post being in a shape of a triangle pole, or a triangle pole with a triangular cone or a truncated triangular cone provided thereon as an upper part.

9. The sample holder according to claim 1, wherein the cavity has a depth from a top, equivalent to at least two times a thickness of a chip to be accommodated in the through opening of the PCB.

10. The sample holder according to claim 1, wherein the post has a planar shape of an isosceles triangle with two equal sides, a length of the equal side set less than half a length of a short side of a rectangle planar shape of the chip.

11. The sample holder according to claim 1, comprising a metal sheet placed on the pedestal, with the PCB placed thereon.

12. The sample holder according to claim 1, comprising a metal lid placed on the front surface of the PCB, the metal lid electrically in contact with a ground plane on the front surface of the PCB.

13. The sample holder according to claim 1, wherein the PCB includes:
a board substrate;
a wiring layer including signal lines on a first surface of the substrate;
a ground layer on a second surface opposite to the first surface.

14. A superconducting quantum computer comprising:
a chip including a superconducting quantum circuit; and
a sample holder including:
a pedestal made of metal:
a Printed Circuit Board (PCB) placed on the pedestal, the PCB including a through opening that penetrates from a front surface to a rear surface of the PCB, the chip being housed in a through opening of the PCB and electrically connected with the PCB, wherein the pedestal includes a cavity bottomed and with a top of the pedestal opened, the cavity formed at a portion corresponding to directly under the through opening on a side of the pedestal on which the PCB is placed, as a configuration on the side on which the PCB is placed, viewed from above, a part of the cavity protruded outward from the through opening, and wherein the through opening of the PCB is a bottomless opening in a rectangular planer shape corresponding to a rectangular planar shape of a chip to be mounted in the through opening, the cavity formed in the pedestal is bottomed and top opened with a rectangular planer shape corresponding to a planar shape of the through opening, the pedestal includes, at each of four corners of the rectangular-shaped cavity bottomed and top opened, a support member to support the chip when the chip is mounted thereto, and as the configuration of the pedestal on the side on which the PCB is placed, viewed from above, the cavity has at least a part of a region other than a region with the support member arranged, protruded outwardly by a predetermined width against at least a part of a side connecting two adjacent corners of the through opening.

15. The superconducting quantum computer according to claim 14, wherein the cavity is cruciform in a shape on at least a top surface thereof.

16. The superconducting quantum computer according to claim 14, wherein the cavity is in a shape of a bottomed hollow cylinder with a top thereof opened.

17. The superconducting quantum computer according to claim 14, wherein the cavity is in a shape of a hollow hemisphere with a top thereof opened.

* * * * *